United States Patent
Liang et al.

(10) Patent No.: US 7,415,690 B2
(45) Date of Patent: Aug. 19, 2008

(54) APPARATUS AND METHODS FOR MULTI-GATE SILICON-ON-INSULATOR TRANSISTORS

(75) Inventors: Minchang Liang, Santa Clara, CA (US); Yow-Juang W. Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/930,105

(22) Filed: Oct. 31, 2007

(65) Prior Publication Data

US 2008/0061821 A1 Mar. 13, 2008

Related U.S. Application Data

(62) Division of application No. 11/466,565, filed on Aug. 23, 2006, now Pat. No. 7,307,445, which is a division of application No. 10/849,074, filed on May 19, 2004, now Pat. No. 7,112,997.

(51) Int. Cl.
*H03K 17/693* (2006.01)

(52) U.S. Cl. .......................................... 716/16; 326/38
(58) Field of Classification Search ............... 716/8–16; 326/37–41
See application file for complete search history.

(56) References Cited

U.S. PATENT DOCUMENTS

2006/0244741 A1 * 11/2006 Kimura et al. .............. 345/204

* cited by examiner

*Primary Examiner*—Don P Le
(74) *Attorney, Agent, or Firm*—Law Offices of Maximilian R. Peterson

(57) ABSTRACT

An integrated circuit (IC) includes mechanisms for adjusting or setting the gate bias of one gate of one or more multi-gate transistors. The IC includes a gate bias generator. The gate bias generator is configured to set gate bias of one gate of the one or more multi-gate transistors within the IC. More specifically, the gate bias generator sets the gate bias of the transistor(s) so as to trade off performance and power consumption of the transistor(s).

9 Claims, 18 Drawing Sheets

APPARATUS AND METHODS FOR MULTI-GATE SILICON-ON-INSULATOR TRANSISTORS

CROSS-REFERENCE TO RELATED APPLICATIONS

This patent application is a divisional application of U.S. patent application Ser. No. 11/466,565, titled "Apparatus and Methods for Multi-Gate Silicon-on-Insulator Transistors," filed on Aug. 23, 2006 now U.S. Pat. No. 7,307,445, which is a divisional of U.S. patent application Ser. No. 10/849,074, titled "Apparatus and Methods for Multi-Gate Silicon-on-Insulator Transistors," filed on May 19, 2004 now U.S. Pat. No. 7,112,997, the foregoing applications all incorporated by reference herein.

TECHNICAL FIELD

The inventive concepts relate generally to multi-gate silicon-on-insulator (SOI) devices and, more particularly, to using such devices in programmable logic devices (PLDs).

BACKGROUND

PLDs are ubiquitous electronic devices that provide flexibility to not only designers, but also end-users. During the design cycle of an electronic circuit or system, a designer may perform a relatively large number of design iterations by simply re-programming the PLD for each design. Thus, the length and expense of the design cycle decreases compared to other alternatives. Similarly, the end-user may have a desired level of control over the functionality of a design that includes PLD(s). By programming the PLD(s) in the field or even on a real-time basis, the user can change the way the circuit or system behaves.

To accommodate increasingly complex designs, modern PLDs include a relatively large number of transistors. Furthermore, users demand ever higher performance, which results in larger operating frequencies. Consequently, the power consumption, power dissipation, die temperatures and, hence, power density (power dissipation in various circuits or blocks), of PLDs has tended to increase. The upward march of the power density, however, may make PLD design and implementation impractical or failure-prone. A need exists for PLDs that feature adjustable or configurable power consumption and performance.

SUMMARY

One aspect of the invention relates to apparatus for adjusting, modifying, or programming performance (e.g., power consumption) of transistors within an IC, such as a PLD. In one embodiment, an IC includes a bias generator configured to set a gate bias of a multi-gate transistor within the IC. The bias generator sets the gate bias of the transistor so as to trade off performance and power consumption of the transistor.

In another embodiment, a PLD includes a control circuit, a gate bias generator, and a switch. The gate bias generator couples to the control circuit. The gate bias generator sets a gate bias of a multi-gate transistor within the PLD. The switch couples to the control circuit. The switch selectively shuts down a first circuit within the PLD.

In a third embodiment, a PLD includes a temperature sensor, a gate bias generator, and a control circuit. The temperature sensor senses a temperature of a first circuit in the PLD. The gate bias generator sets a gate bias of a set of multi-gate transistors in response to a control signal. The control circuit couples to the temperature sensor and the gate bias generator. The control circuit provides the control signal in response to a signal received from the temperature sensor.

Another aspect of the invention relates to fabrication and structure of multi-gate transistors. In one embodiment, a multi-gate SOI transistor includes a semiconductor region disposed above a layer of insulator. The SOI transistor also includes a source region and a drain region formed above another layer of insulator disposed above the semiconductor region. The SOI transistor has a top gate fabricated above a gate insulator layer disposed above the source and drain regions. The semiconductor region acts as a lower gate of the transistor.

Another aspect of the invention relates to methods of configuring or operating a PLD. In one embodiment, a method according to the invention includes mapping the electronic circuit to functional resources within the PLD to generate a design to be implemented by the PLD. The method also includes identifying at least one critical circuit path in the design to be implemented by the PLD, and programming a gate bias level of at least one multi-gate transistor in the at least one critical circuit path.

In another embodiment, a method of operating a PLD includes setting a gate bias level of at least one multi-gate transistor in the PLD to a desired or initial level. The method also includes determining whether a performance measure of the PLD meets a criterion, and adjusting the gate bias level of the at least one transistor depending on whether the performance measure of the PLD meets the criterion. In other embodiments, in addition to the performance measures, the method may take into account whether a temperature level of the PLD meets at least one criterion and adjusting the gate bias level of the transistor depending on the result of that determination.

In yet another embodiment, a method of operating a PLD configured to function in an operating environment includes setting a gate bias level of at least one multi-gate transistor in the PLD to a given or desired level. The method also includes adjusting the gate bias level of the at least one transistor depending on at least one characteristic of the operating environment of the PLD. In other embodiments, the method may adjust the gate bias level of the transistor depending on at least one characteristic of operating environment and a temperature level of the PLD.

BRIEF DESCRIPTION OF THE DRAWINGS

The appended drawings illustrate only exemplary embodiments of the invention and therefore should not be considered as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

DETAILED DESCRIPTION

The inventive concepts contemplate apparatus and associated methods for PLDs that feature adjustable power and performance. The inventive concepts help to overcome excessive power density levels that conventional PLDs suffer. Moreover, one may adjust the performance level of a desired portion, or all, of a PLD according to the invention (i.e., on a granular basis ranging from individual transistors all the way to the entire PLD circuitry). More specifically, and as described below in detail, the inventive concepts use a novel multi-gate silicon-on-insulator (SOI) transistor. One may lower or increase the nominal threshold voltage of the transistor. By setting, programming, or adjusting the threshold voltage of individual transistors, or groups of transistors in a PLD, one may the power consumption and performance of the transistor(s) and, hence, of the PLD.

The inventive concepts provide the following benefits over traditional implementations. First, they allow trading off performance and power consumption or optimizing the performance-power consumption tradeoff. Second, one may selectively set, program, or adjust the threshold voltage(s) in critical circuit paths or parts of the PLD so as to increase their performance as desired. Conversely, one may selectively set, program, or adjust the threshold voltage(s) in non-critical circuit paths or parts of the PLD and therefore reduce their power consumption and lower their power densities.

In addition, one may shut down or disable unused parts or circuits within the PLD, thus reduce their power consumption and lower their power densities. One may also employ the inventive concepts to prevent (or reduce the probability of) thermal runaway. More specifically, in a traditional PLD, circuits operating at relatively high speeds tend to consume more power, resulting in temperature increase of the PLD. The increased power consumption may cause those circuits to consume more power. This positive feedback mechanism may increase the power densities to unsafe or destructive levels.

Figure 1:
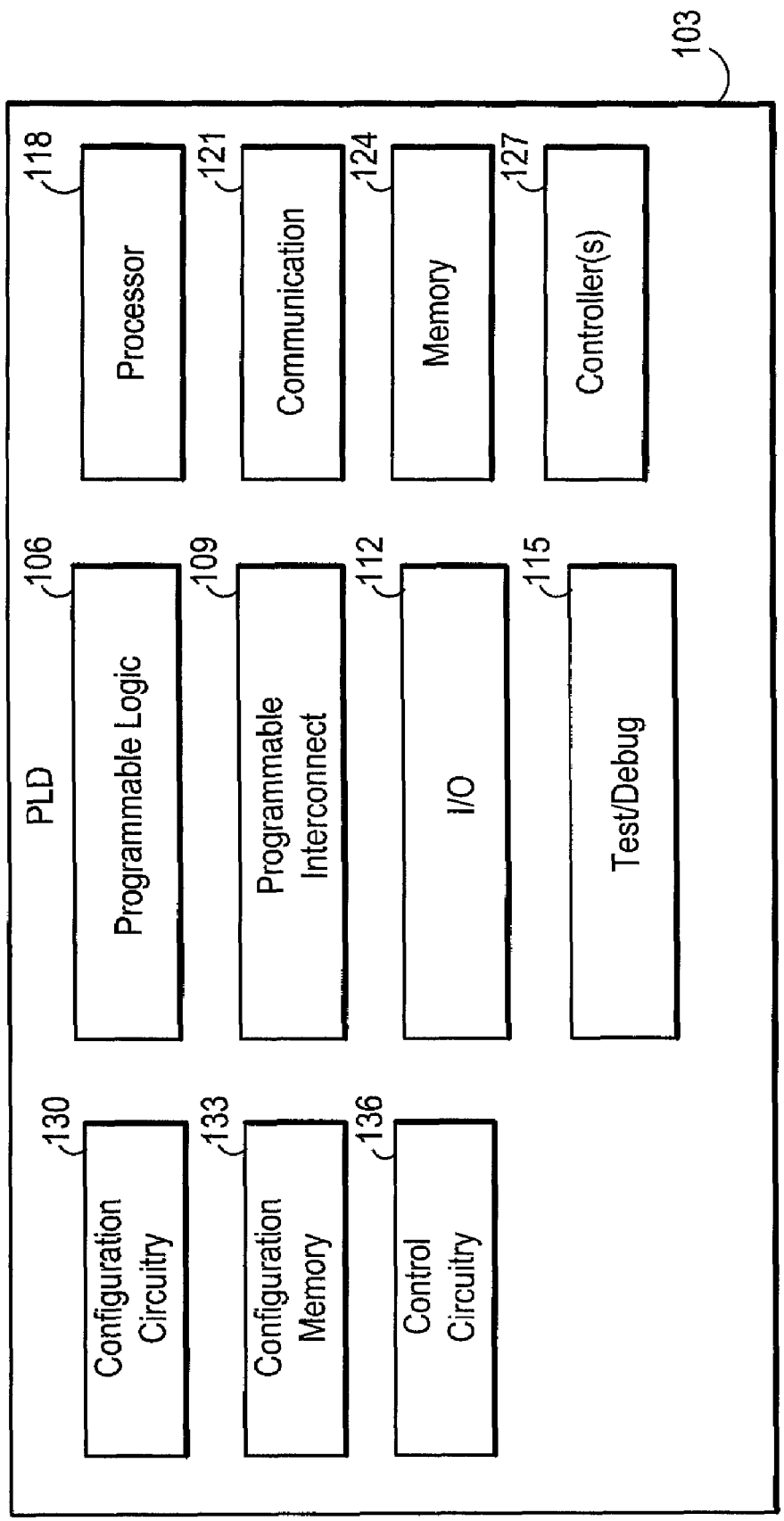
FIG. 1 shows a general block diagram of a PLD according to an illustrative embodiment of the invention.

FIG. 1 shows a general block diagram of a PLD 103 according to an illustrative embodiment of the invention. One may use multi-gate SOI transistors according to the invention in various circuits (described below in detail) within PLD 103. PLD 103 includes configuration circuitry 130, configuration memory 556, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired. Note that FIG. 1 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers, logic gates, registers, memory, and the like. Programmable interconnect 109 couples to programmable logic 106 and provides configurable interconnects (coupling mechanisms) between various blocks within programmable logic 106 and other circuitry within or outside PLD 103. Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. The configuration data determine the functionality of PLD 103 by programming programmable logic 106 and programmable interconnect 109, as persons skilled in the art with the benefit of the description of the invention understand.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices. Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

As noted above, PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuitry 121. Communication circuitry 121 may facilitate data and information exchange between various circuits within PLD 103 and circuits external to PLD 103, as persons of ordinary skill in the art who have the benefit of the description of the invention understand. As an example, communication circuitry 121 may provide various protocol functionality (e.g., Transmission Control Protocol/Internet Protocol (TCP/IP), User Datagram Protocol (UDP) etc.), as desired. As another example, communication circuitry 121 may include network (e.g., Ethernet, token ring, etc.) or bus interface circuitry, as desired. PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

The blocks of circuitry within PLD 103 include a number of transistors. More particularly, in exemplary embodiments, the transistors (or at least some of the transistors) may constitute multi-gate SOI transistors according to the invention. The transistors may constitute either N-type, P-type, or a combination of those types of transistor, as desired. As noted above, the inventive concepts include a novel multi-gate SOI transistor. In exemplary embodiments, the transistor constitutes fully depleted (FD-SOI) transistor. FIGS. 2-9 show the various steps in fabricating (and the resulting structures) multi-gate SOI transistors according to exemplary embodiments.

Figure 2:
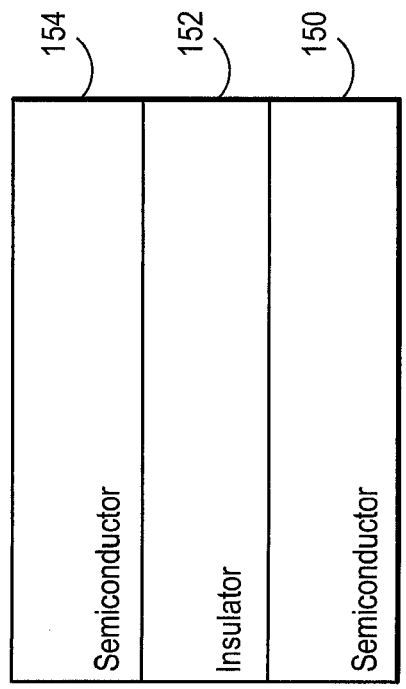

FIG. 2 shows a semiconductor structure processed according to an exemplary embodiment of the invention. The structure includes a semiconductor substrate or layer 150 (e.g., a silicon substrate), an insulator layer 152 (e.g., a layer of silicon dioxide ($SiO_2$) layer), and a semiconductor layer 154 (e.g., a layer of silicon). As persons of ordinary skill in the art understand, the structure in FIG. 2 constitutes a basic SOI structure (i.e., semiconductor layer 154 disposed above or on insulator layer 152). Note that the various layers and substrates may have desired thicknesses (e.g., 100 nm thickness for layer 154) and doping levels and types (e.g., P-type doping or N-type doping) depending on the application and performance specifications, as persons of ordinary skill in the art understand. For example, in one illustrative embodiment, semiconductor layer 154 includes P-type doping.

Figure 3:
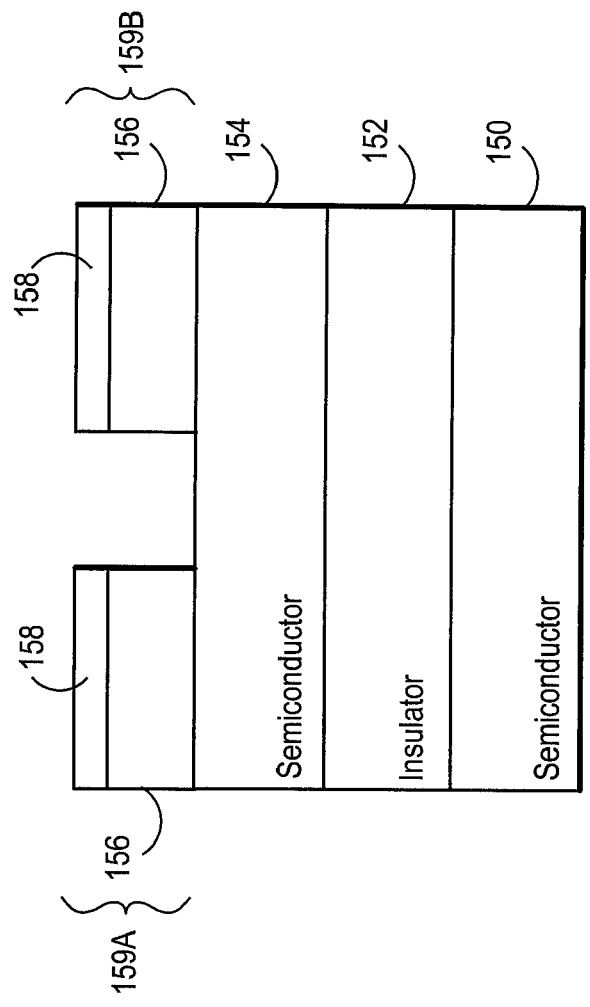
FIGS. 2-9 illustrate various structures fabricated in order to produce multi-gate SOI transistors according to exemplary embodiments of the invention.

FIG. 3 shows the structure in FIG. 2, further processed according to an exemplary embodiment of the invention. More specifically, starting with the structure in FIG. 2, one fabricates (e.g., deposits or grows) an insulator layer 156 with a desired thickness (e.g., 20 nm), and a mask layer 158 (e.g., a layer of silicon nitride, SiN). One then forms a pattern in mask layer 158 and etches mask layer 158 and insulator layer 156 so as to generate structures 159A and 159B. Structures 159A and 159B constitute the substrate well regions for the formation of multi-gate SOI transistors according to the invention.

Figure 4:
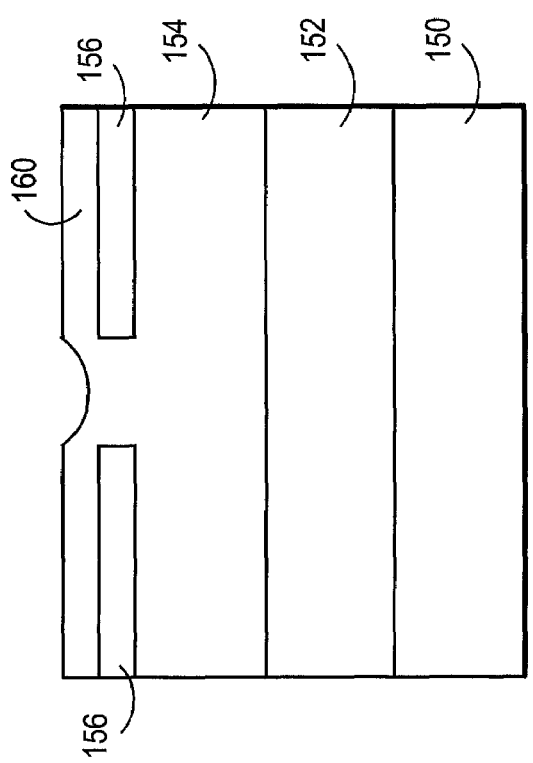

FIG. 4 shows the structure in FIG. 3, further processed according to an exemplary embodiment of the invention. Starting with the structure shown in FIG. 3, one strips mask layer 158. Next, one deposits an amorphous semiconductor (e.g., amorphous silicon) layer 160, with a desired thickness (e.g., 20 nm). One may then use an appropriate technique, such as solid-phase epitaxy, to crystallize semiconductor layer 160, as persons of ordinary skill in the art who have the benefit of the description of the invention understand.

Figure 5:
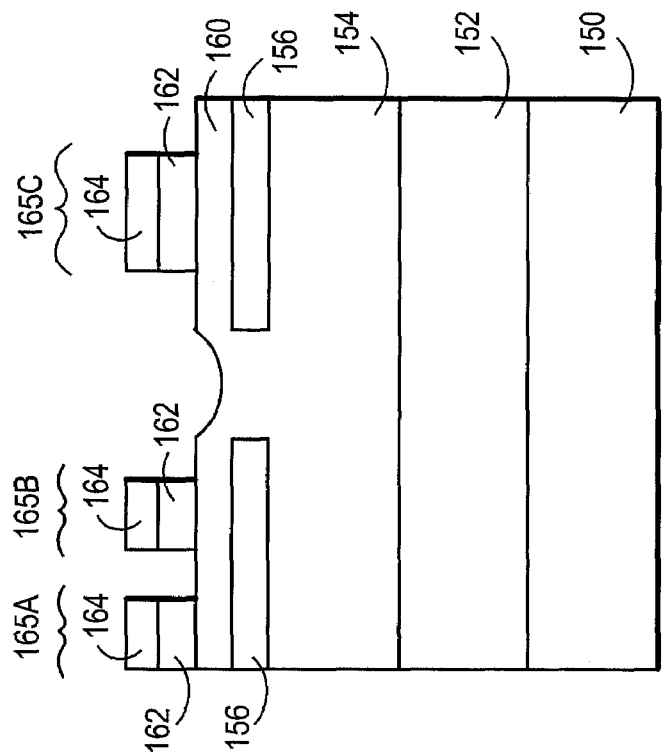

FIG. 5 shows the structure in FIG. 4, further processed according to an exemplary embodiment of the invention. More specifically, one processes the structure of FIG. 4 to define isolation regions, such as shallow-trench isolation. Referring to FIG. 5, one deposits an insulator layer 162 (e.g., a layer of silicon dioxide) above crystallized semiconductor layer 160. One then deposits mask layer 164 (e.g., a layer of silicon nitride) above insulator layer 162. By etching mask layer 164 and insulator layer 162, one defines patters for the active areas of the resulting transistors. More specifically, one etches mask layer 164 and insulator layer 162 to define structures 165A-165C. One subsequently uses structures 165A-165C to fabricate the transistor active areas, as described below in detail.

Figure 6:
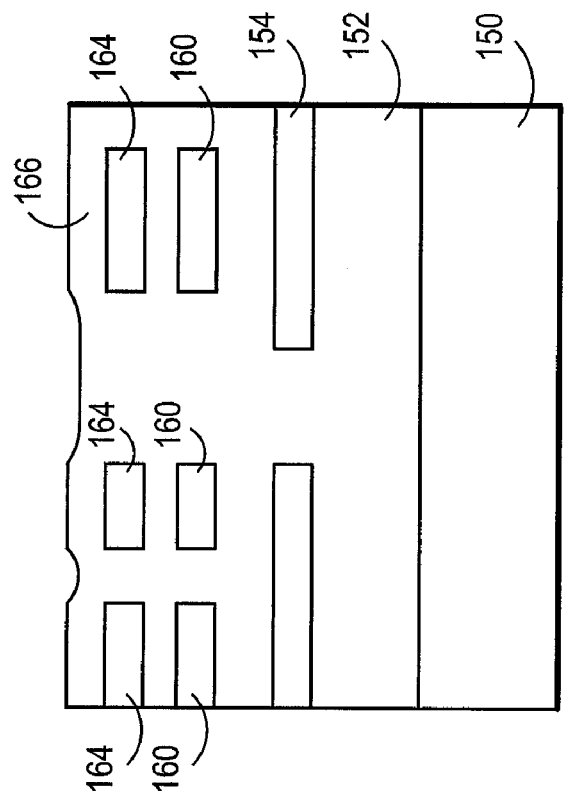

FIG. 6 depicts the structure in FIG. 5, further processed according to an exemplary embodiment of the invention. Starting with the structure in FIG. 5, one etches away the semiconductor areas between structures 165A-165C. In other words, one etches or otherwise removes the uncovered areas of semiconductor layer 160 down to insulator layer 152. Next, one fabricates insulator area or layer 166 so as to fill the voids from the etching or removal process and also to cover mask layer 164. The resulting structure may have a non-planar top surface, as FIG. 6 shows.

Figure 7:
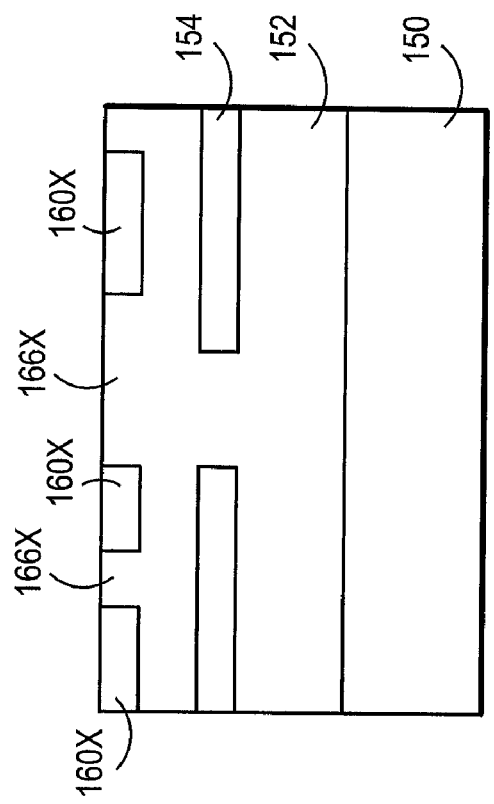

FIG. 7 shows the structure in FIG. 6, further processed according to an exemplary embodiment of the invention. Beginning with the structure in FIG. 6, one processes its top surface so as to make it relatively flat or planar. One may use any appropriate technique to do so, for example, chemical mechanical polish (CMP), as persons of ordinary skill in the art who have the benefit of the description of the invention understand. Subsequently, one etches or otherwise removes insulator layer 166 and mask layer 160 down to semiconductor regions or layer 160. Note that at this point in the fabrication process, semiconductor layer 160 forms semiconductor regions 160X, isolated from one another by regions in the remaining portions (labeled as 166X) of insulator layer 166. Next, one forms transistors (and/or other semiconductor devices) in semiconductor regions 160X.

Figure 8:
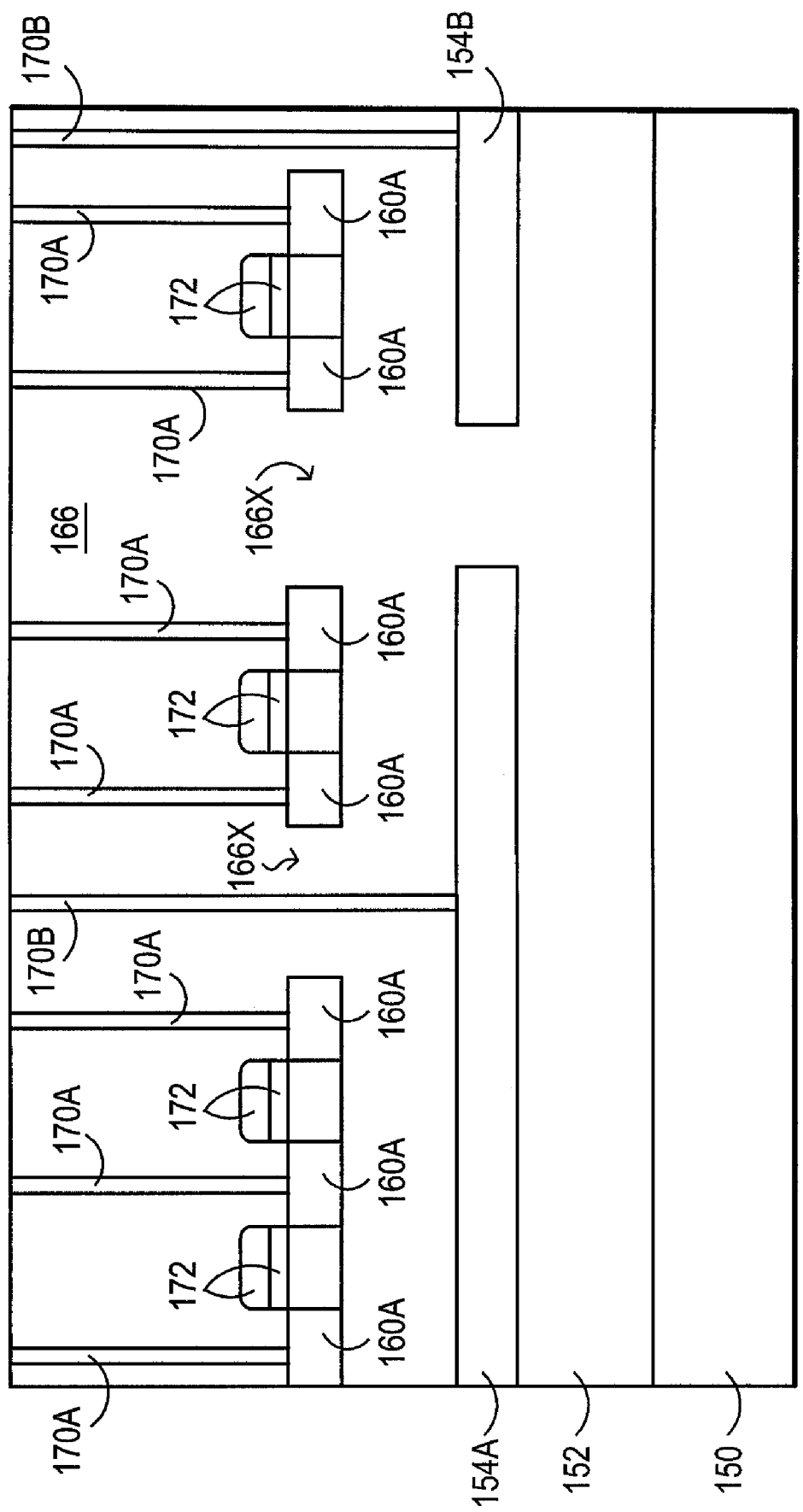
Figure 9:
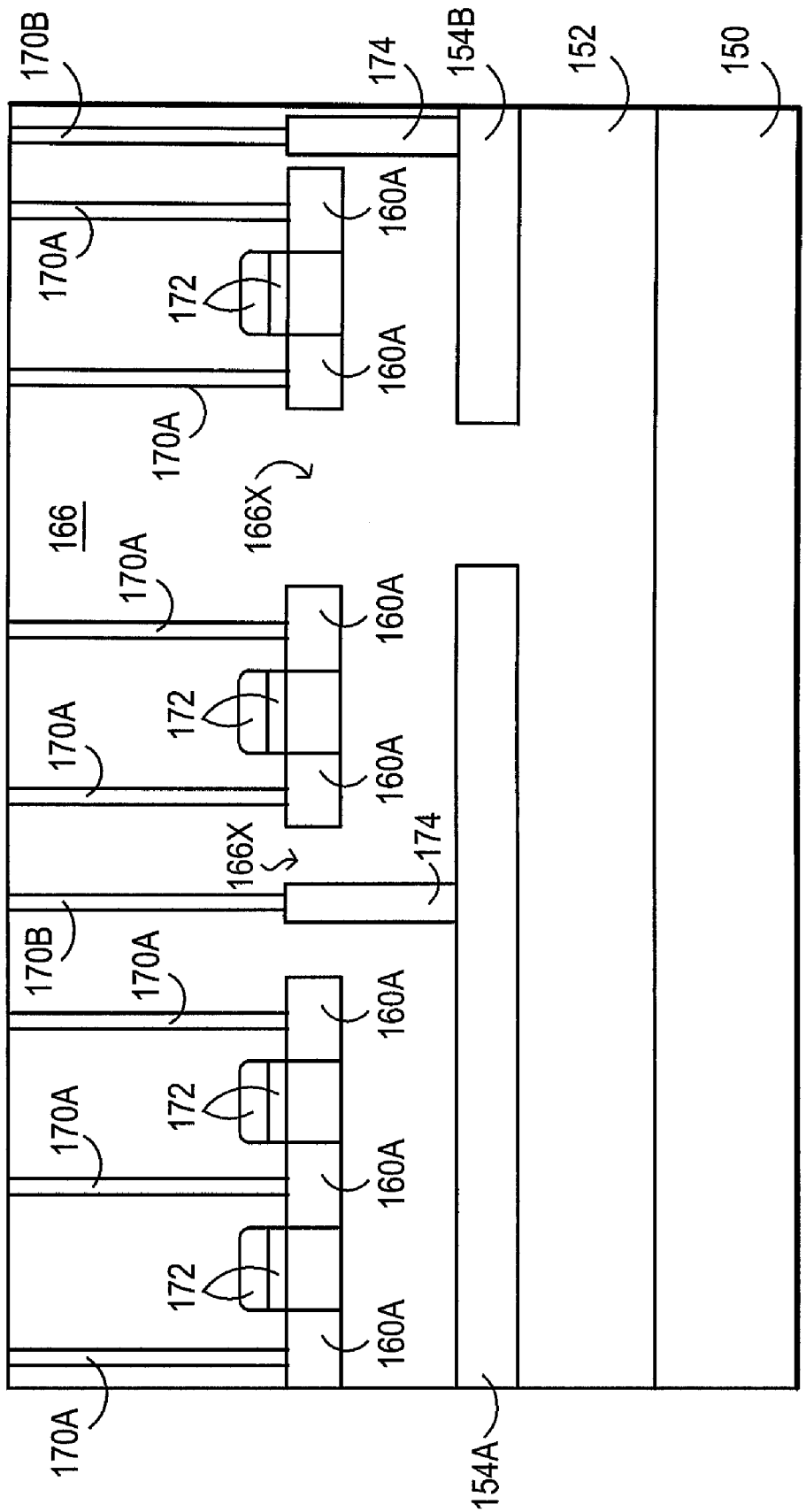

FIGS. 8 and 9 show two alternative arrangements for forming active devices (such as multi-gate SOI transistors) and contacts or vias for coupling the active devices to one another to form desired electronic circuitry. To form transistors, one may use a suitable fabrication process, such as front end of line (FEOL) complementary metal oxide semiconductor (CMOS) process, as persons of ordinary skill in the art who have the benefit of the description of the invention understand. More specifically, FIG. 8 shows the structure in FIG. 7, further processed to an exemplary embodiment of the invention. One forms source/drain regions 160A and gate structures 172 (gate insulator, together with gate electrode or region, such as polysilicon) and forms salicide in the gate and source/drain regions, as persons of ordinary skill in the art who have the benefit of the description of the invention understand. In addition, one forms contacts 170A and 170B. Contacts 170A provide a coupling mechanism to various regions (e.g., source/drain regions 170A) of the active devices or transistors. Contacts 170B provide a coupling mechanism to respective semiconductor regions 154A and 154B.

FIG. 9 shows the structure in FIG. 7, further processed to another exemplary embodiment of the invention. One first makes openings or holes through region 166X and deposits polysilicon in the holes to form polysilicon regions 174, which provide coupling mechanisms to region 154A and region 154B. Then, similar to FIG. 8, one forms source/drain regions 160A and gate structures 172 (gate insulator, together with gate region, such as polysilicon) and forms salicide in the gate and source/drain regions, as persons of ordinary skill in the art who have the benefit of the description of the invention understand. In addition, one forms contacts 170A and 170B. Contacts 170A provide a coupling mechanism to various regions (e.g., source/drain regions 170A) of the active devices or transistors. Contacts 170B, together with polysilicon regions 174, provide a coupling mechanism to respective semiconductor regions 154A and 154B.

Note that regions 154A and 154B of semiconductor layer 154 form a second gate region for the SOI transistors. In other words, referring to the transistors formed above semiconductor region 154A, gate structures 172 form one gate region of the transistors, whereas semiconductor region 154A forms another gate region (a lower or back gate region) of those transistors. Similarly, with respect to the transistors formed above semiconductor region 154B, gate structures 172 form one gate region of the transistors, whereas semiconductor region 154A forms another gate region (a lower or back gate region) of those transistors. One may apply a gate bias to the lower or back gate regions (i.e., semiconductor regions 154A and 154B) using the respective contacts 170B.

Exemplary embodiments described here may use a variety of processing and fabrication parameters (thickness of layers, dopant type, materials, and the like), as desired. Depending on the design and performance specifications for a particular implementation and available fabrication technology, one may use a wide range of parameters, as desired, and as persons skilled in the art with the benefit of the description of the invention understand. Furthermore, the processing steps and the order of the processing of the semiconductor materials in exemplary embodiments described here relate to present semiconductor fabrication and processing technologies. Persons of ordinary skill in the art with the benefit of the description of the invention understand that one may use variations of those processes or other processes that are currently available or become available in the future.

Semiconductor regions 154A and 154B form insulated gate regions for the SOI transistors. In other words, insulator region or layer 166 insulates semiconductor regions 154A and 154B (i.e., the second gate regions for the respective SOI transistors) from the other parts of the SOI transistors, such as source/drain regions 160A. As a result, one may apply a positive or negative bias to each of semiconductor regions 154A and 154B, as desired. The insulated second gate regions (semiconductor regions 154A and 154B) prevent a forward-biased junction and therefore allow using a relatively wide range of gate bias levels.

By applying a suitable gate bias to the lower or back gate regions (semiconductor regions 154A and 154B), one may modify, set, or modulate the threshold voltage, $V_T$, of the respective fully depleted (FD-SOI) transistors. More specifically, the application of a gate bias may either attract or repel carriers in the respective FD-SOI transistor, thus either assist or counteract the formation of the inversion layer. As a result, one may effectively decrease or increase the threshold voltage of the transistor by applying a suitable bias to the lower or back gate (e.g., semiconductor region 154A or semiconductor region 154B). An increased threshold voltage in turn causes a decrease in the drain current, $i_D$, of the transistor, and vice-versa. Thus, for a constant gate-to-source-voltage (i.e., the voltage between the traditional or top gate region and the source region), biasing the lower or back gate region changes the current-drive capability (one measure of performance or speed) of the transistor. A decrease current-drive capability leads to slower circuit operation and, ultimately, to slower operation of the PLD (or other circuitry) that includes the transistor, and vice-versa.

The power dissipation of the transistor also varies according to changes in its threshold voltage. More specifically, a smaller threshold voltage increases the OFF-state leakage current ($I_{off}$) of the transistor, and vice-versa. The $I_{off}$ of the transistor affects its static (non-switching) power dissipation. In addition, a smaller threshold voltage increases the dynamic or switching power dissipation of the transistor. Thus, changing the threshold voltage by adjusting the lower or back gate bias (i.e., the bias applied to semiconductor regions 154A and 154B) affects the power dissipation of the SOI transistor.

As the above description shows, one may affect the performance of the multi-gate SOI transistor by adjusting its lower or back gate bias, which ultimately results in a change in its threshold voltage. Adjusting the lower or back gate bias affects performance measures such as current-drive capability, speed of operation, power dissipation, etc. As noted above, in embodiments according to the invention, one may adjust the lower or back gate bias of individual transistors, individual circuits or blocks within the PLD, groups of transistors or blocks, or even the entire PLD, as desired. Furthermore, one may control the lower or back gate bias of individual NMOS and PMOS transistors, or the lower or back gate biases of groups of NMOS and PMOS transistors, as desired. The following description provides the details.

Figure 10:
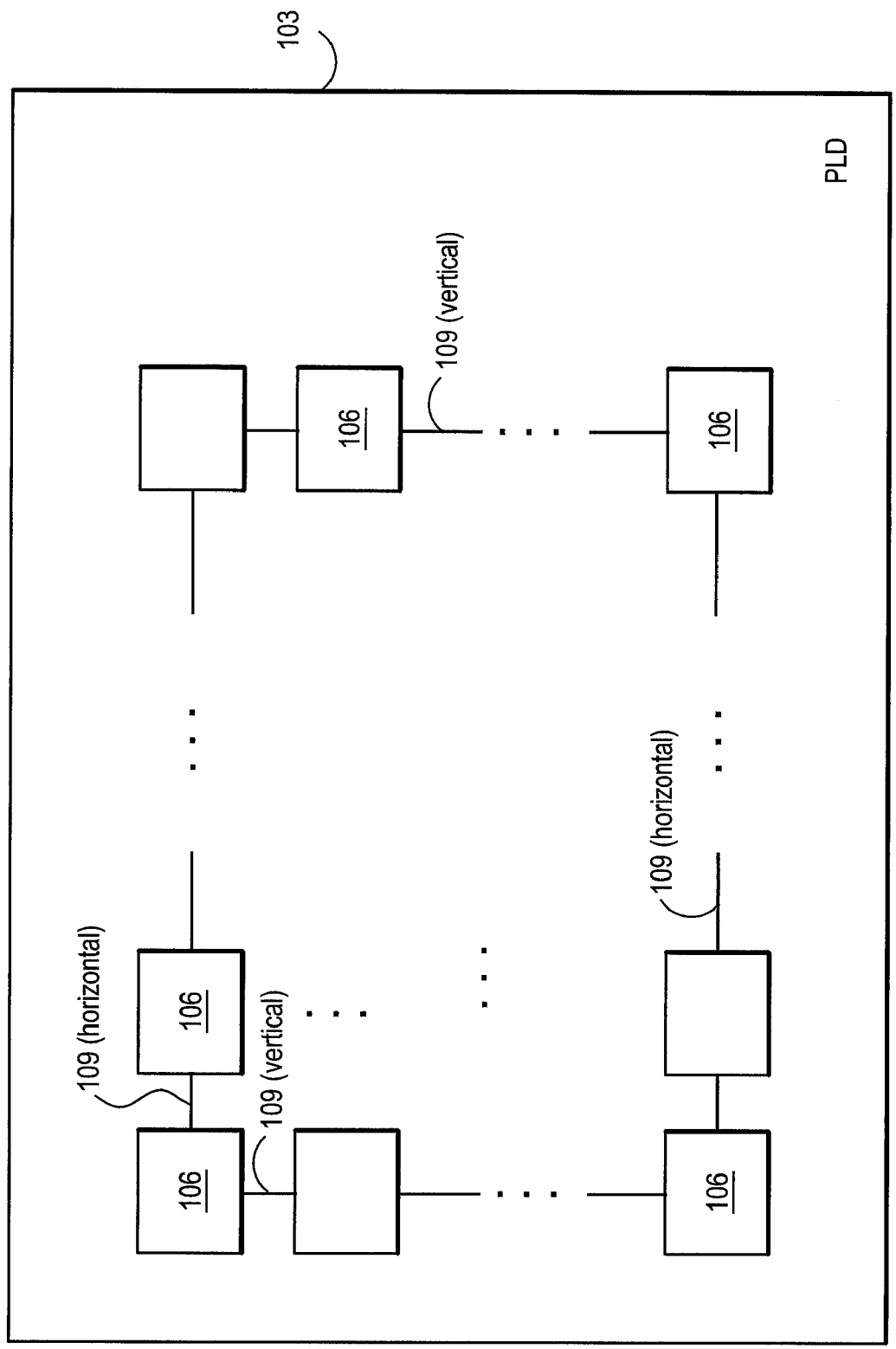
FIG. 10 illustrates a floor-plan of a PLD according to an exemplary embodiment of the invention.

FIG. 10 shows a floor-plan of a PLD 103 according to an exemplary embodiment of the invention. PLD 103 includes programmable logic 106 arranged as a two-dimensional array. Programmable interconnect 109, arranged as horizontal interconnect and vertical interconnect, couples the blocks of programmable logic 106 to one another. One may adjust the lower or back gate bias of the transistors in each block of programmable logic 106, each segment of programmable interconnect 109, or both, as desired. Furthermore, one may adjust the lower or back gate bias of transistors in a portion of one or more blocks of programmable logic 106, a portion of programmable interconnect 109, or both, as desired. In illustrative embodiments, PLDs according to the invention have a hierarchical architecture. In other words, each block of programmable logic 106 in FIG. 10 may in turn include smaller or more granular programmable logic blocks or circuits. One may adjust the lower or back gate bias of transistors (or for each transistor individually) in each level of the hierarchical architecture of the PLD, as desired.

Figure 11:
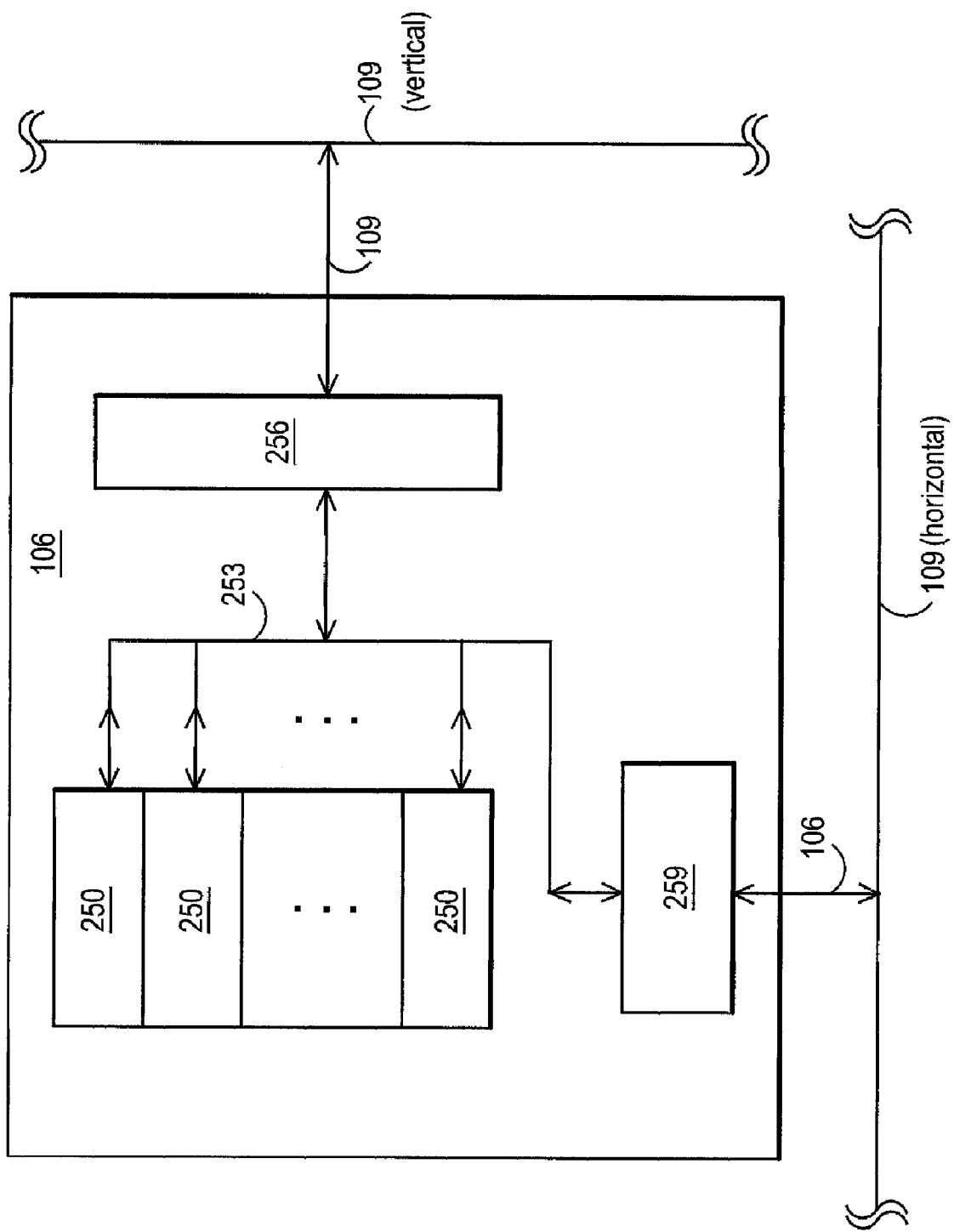
FIG. 11 shows a block diagram of a programmable logic in a PLD according to an exemplary embodiment of the invention.

FIG. 11 shows a block diagram of a programmable logic 106 in a PLD according to an exemplary embodiment of the invention. Programmable logic 106 includes logic elements or programmable logic circuits 250, local interconnect 253, interface circuit 256, and interface circuit 259. Logic elements 250 provide configurable or programmable logic functions, for example, LUTs, registers, product-term logic, etc., as persons of ordinary skill in the art who have the benefit of the description of the invention understand. Local interconnect 253 provides a configurable or programmable mechanism for logic elements 250 to couple to one another or to programmable interconnect 109 (sometimes called "global interconnect"), as desired. Interface circuit 256 and interface circuit 259 provide a configurable or programmable way for programmable logic 106 block of circuitry to couple to programmable interconnect 109 (and hence to other programmable logic 106, as FIG. 10 shows). Interface circuit 256 and interface circuit 259 may include multiplexers (MUXs), registers, buffers, drivers, and the like, as persons of ordinary skill in the art who have the benefit of the description of the invention understand.

One may adjust the lower or back gate bias of transistors in each portion or block of circuitry within PLD 103 (see FIGS. 1, 10, and 11), as desired. Furthermore, one may adjust the lower or back gate bias of transistors in each portion or block of circuitry independently of others, on an individual or collective basis, as desired. Within each portion or block of circuitry, one may adjust the lower or back gate bias of transistors in each sub-block, or groups of sub-blocks, on an individual or collective basis, as desired. For example, one may adjust the lower or back gate bias of transistors in all or a portion of the following circuitry within a PLD according to exemplary embodiments of the invention: one or more of the blocks in FIG. 1 (e.g., programmable logic 106, programmable interconnect 109, etc.); one or more logic elements 250 within one or more programmable logic blocks 106; one or more interface circuits 256 and/or 259, within one or more programmable logic blocks 106; one or more local interconnect within one or more programmable logic 106; and one or more MUXs, drivers, buffers, etc., within one or more interface circuits 256 and/or 259.

As noted above, one may make the lower or back gate bias adjustments in any desired level of granularity. In other words, one may make the adjustments applicable to individual transistors, groups of transistors, sub-blocks, blocks, or the entire PLD, as desired, and as applicable. For example, one may make gate bias adjustments to one or more N-type transistors independently of one or more P-type transistors, as desired. Furthermore, one may adjust the lower or back gate bias of transistors in one element in PLD 103 independently of all other elements, as desired. As persons of ordinary skill in the art with the benefit of the description of the invention understand, one may adjust the lower or back gate bias of transistors in some parts of a PLD and yet provide a fixed or default lower or back gate bias for transistors in other parts of the PLD, as desired.

Figure 12:
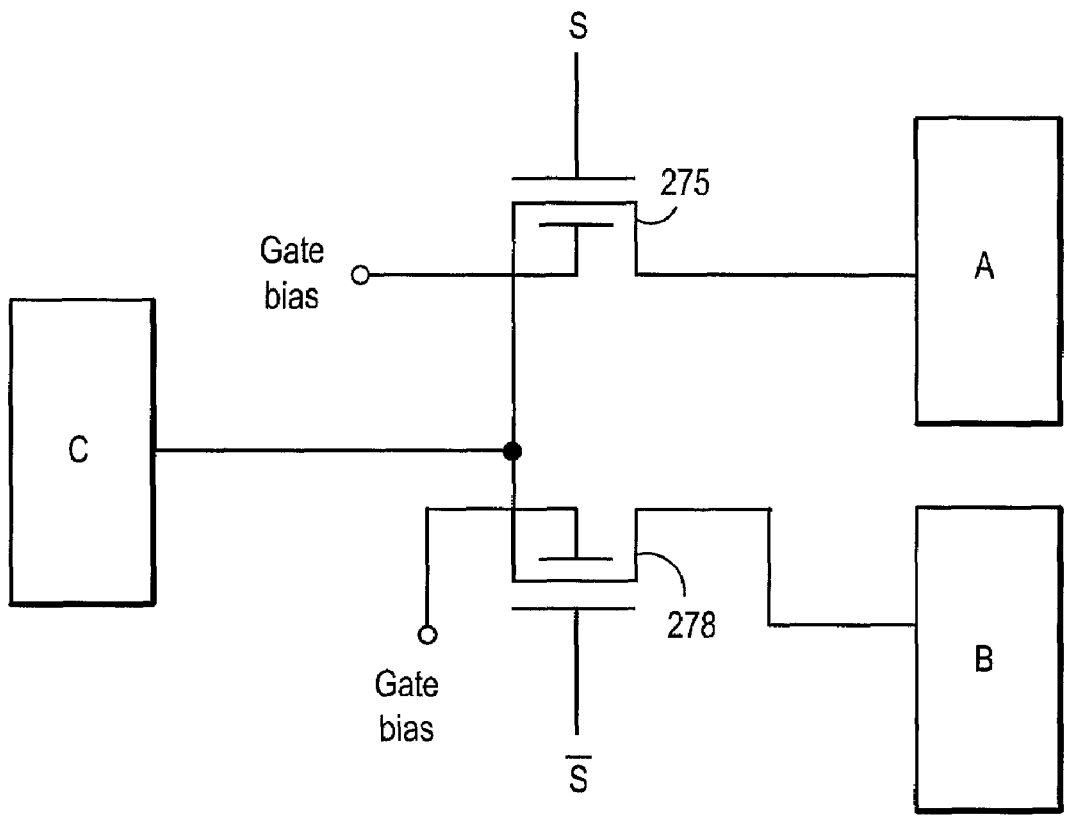
FIG. 12 illustrates a multiplexer used in PLDs according to exemplary embodiments of the invention that incorporate gate bias adjustment.

As an example of the granularity of gate bias adjustment, consider a two-input, one-output MUX. FIG. 12 shows a MUX used in PLDs according to exemplary embodiments of the invention that incorporate gate bias adjustment. The MUX includes transistor 275 and transistor 278. The MUX receives a signal from circuit A and another signal from circuit B. In response to a select signal, S, and its complement, S', the MUX routes to circuit C (coupled to the output of the MUX) either the signal from circuit A or the signal from circuit B. One may adjust the lower or back gate biases of transistor 275 and transistor 278 in a number of ways. First, one may choose to not adjust the gate biases (e.g., use a default gate bias within the PLD). Second, one may adjust the gate bias of transistor 275 to the same level as the gate bias of transistor 278. As an alternative, one may adjust the gate bias of only of transistor 275 and transistor 278. As another choice, one may adjust individually the gate biases of each of transistor 275 and transistor 278.

Thus, one may configure the performance properties of the MUX in a flexible manner. Put another way, one may balance or trade off the speed of operation, current-drive capability, and power dissipation of the MUX against one another. As further examples, note that one may extend the gate bias adjustment concept to a set of transistors in a MUX, to a particular signal route (e.g., a signal routing corresponding to a particular input), to a set of pass transistors (for example, a set of pass transistors in programmable routing, which feed a MUX shared by other sets of pass transistors to save configuration memory bit counts), etc.

Figure 13:
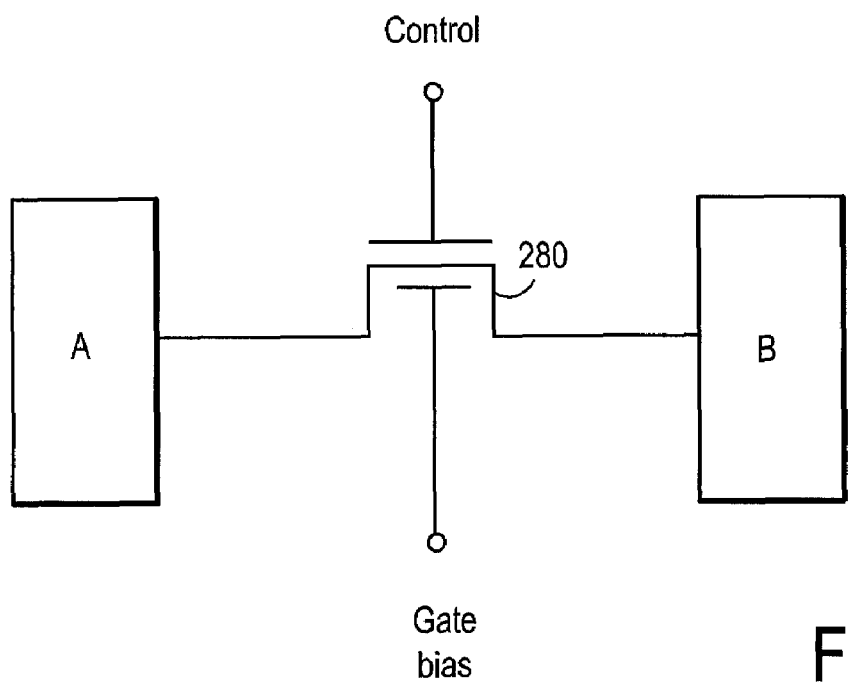
FIG. 13 shows a circuit arrangement that includes a pass transistor according to the invention.

FIG. 13 depicts a circuit arrangement according to an exemplary embodiment of the invention that includes pass transistor 280. In response to a control signal, transistor 280 provides a signal from circuit A to circuit B (circuits A and B constitute a source circuit and a destination circuit, for example, circuitry within a PLD according to the invention). For a given supply voltage, $V_{DD}$, an increase in the threshold voltage limits the maximum voltage that the transistor can transmit when operating as a pass transistor. In other words, if the threshold voltage increases to the point that it equals or exceeds the front or top gate-to-source-voltage, $v_{GS}$, the drain current reduces to zero. Thus, a voltage applied to the drain of the transistor, for example, a voltage that corresponds to a logic 1 level, fails to properly transmit to the source of the transistor. Consequently, the transistor fails to operate reliably as a pass transistor. For a given signal level from circuit A, a sufficiently high threshold voltage of transistor 280 cause it to cease functioning reliably as a pass transistor. By providing a lower or back gate bias signal, one may change (reduce) the threshold voltage of transistor 280 so that it can properly function as a pass transistor.

Figure 14:
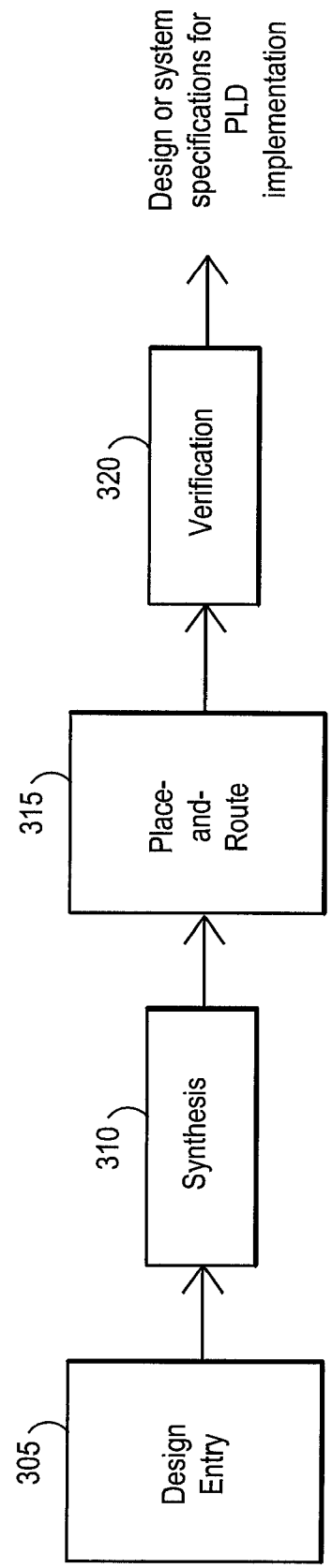
FIG. 14 depicts various software modules that PLD computer-aided design (CAD) software according to illustrative embodiments of the invention uses.

As noted above, the user may adjust the lower or back gate bias of various portions of PLDs according to the invention. The user may do so by using the software used to map a design to a PLD. FIG. 14 depicts various software modules that PLD computer-aided design (CAD) software according to illustrative embodiments of the invention uses. The modules include design-entry module 305, synthesis module 310, place-and-route module 315, and verification module 320. Design-entry module 305 allows the integration of multiple design files. The user may generate the design files by using design-entry module 305 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Design importer and interface generator 136 allows the user to import designs and to generate desired interfaces to those designs. Design importer and interface generator 136 may at least in part reside within design-entry module 305. Because design importer and interface generator 136 operates on some outputs of design-entry module 305 (for example, to generate appropriate interfaces), design importer and interface generator may constitute a separate block or module from design-entry module 305, as desired. Synthesis module 310 accepts the output of design-entry module 305. Based on the user-provided design, synthesis module 310 generates appropriate logic circuitry that realizes the user-provided design. One or more PLDs (not shown explicitly) implement the synthesized overall design or system. Synthesis module 310 may also generate any glue logic that allows integration and proper operation and interfacing of various modules in the user's designs. For example, synthesis module 310 provides appropriate hardware so that an output of one block properly interfaces with an input of another block. Synthesis module 310 may provide appropriate hardware so as to meet the specifications of each of the modules in the overall design or system.

Furthermore, synthesis module 310 may include algorithms and routines for optimizing the synthesized design. Through optimization, synthesis module 310 seeks to more efficiently use the resources of the one or more PLDs that implement the overall design or system. Synthesis module 310 provides its output to place-and-route module 315. Place-and-route module 315 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 315 helps optimize the performance of the overall design or system. By proper use of PLD routing resources, place-and-route module 315 helps to meet the critical timing paths of the overall design or system. Place-and-route module 315 optimizes the critical timing paths to help provides timing closure faster in a manner known to persons of ordinary skill in the art with the benefit of the description of the invention. As a result, the overall design or system can achieve faster performance (i.e., operate at a higher clock rate or have higher throughput).

Furthermore, place-and-route module 315 adjusts the lower or back gate bias of transistors in a portion of or all of the PLD(s) that implement the design or system. Place-and-route module 315 may do so automatically, according to user-specified criteria, or a combination of the two. Place-and-route module 315 may use the user-specified criteria (for example, performance specifications, such as power dissipation, speed, and/or current-drive capability). In addition, or instead, place-and-route module 315 may use the information about critical paths within the design or system to adjust lower or back gate biases of parts or all of the design or system, as desired. For example, place-and-route module 315 may adjust the gate biases of transistors in the critical parts of the design or system so as to achieve higher performance. Place-and-route module 315 may take into account power dissipation criteria (e.g., maximum power density) so as to trade off power and performance, as desired. Place-and-route module 315 provides the optimized design to verification module 320.

Verification module 320 performs simulation and verification of the design. The simulation and verification seek in part to verify that the design complies with the user's prescribed specifications. The simulation and verification also aim at detecting and correcting any design problems before prototyping the design. Thus, verification module 320 helps the user to reduce the overall cost and time-to-market of the overall design or system. Verification module 320 may support and perform a variety of verification and simulation options, as desired. The options may include design-rule checking, functional verification, test-bench generation, static timing analysis, timing simulation, hardware/software simulation, in-system verification, board-level timing analysis, signal integrity analysis and electro-magnetic compatibility (EMC), formal netlist verification, and power-consumption estimation, as desired. Note that one may perform other or additional verification techniques as desired and as persons of ordinary skill in the art who have the benefit of the description of the invention understand.

Figure 15:
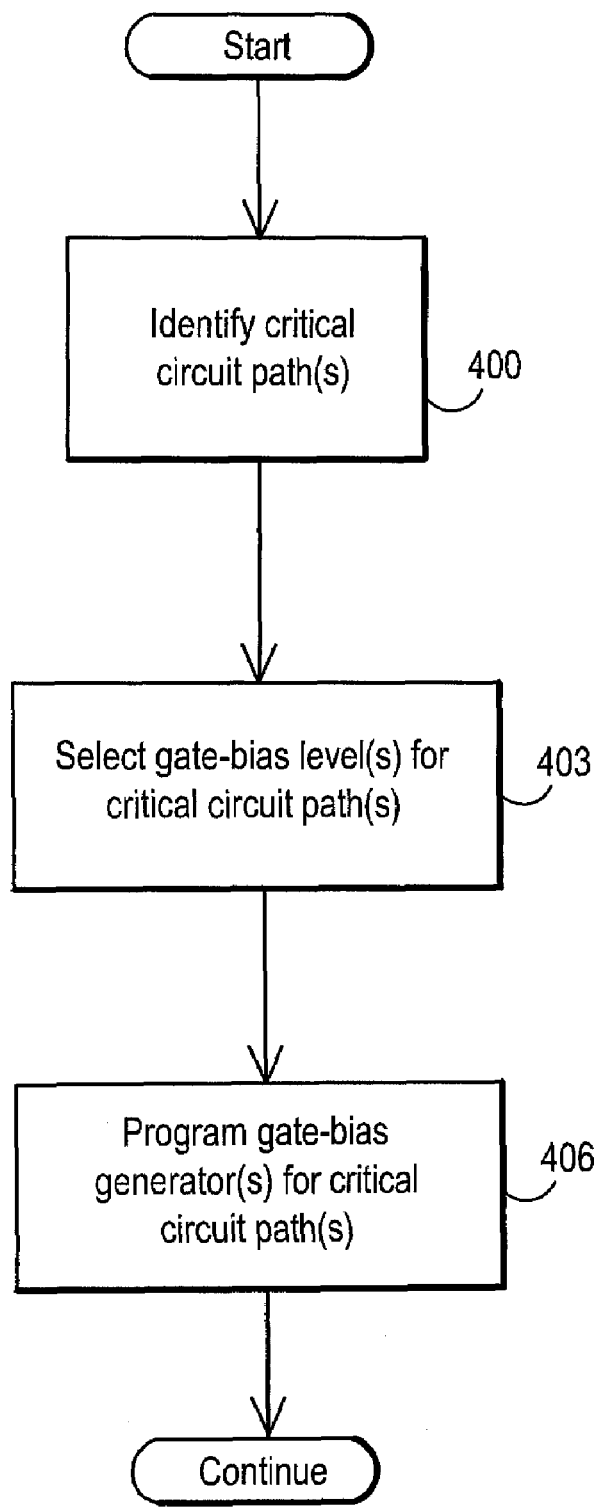
FIG. 15 shows a flow diagram for the process of adjusting lower or back gate bias according to an exemplary embodiment of the invention.

FIG. 15 shows a flow diagram for the process of adjusting lower or back gate bias according to an exemplary embodiment of the invention. A program, such as the software described in conjunction with FIG. 14, may perform the process in FIG. 15. Once the process begins, at 403, it identifies critical circuit path(s) within the PLD that implements the design or system, as described above, and as persons of ordinary skill in the art who have the benefit of the description of the invention understand. At 403, the process adjusts the lower or back gate bias of transistors within the identified critical circuit path(s). In other words, it select one or more gate bias levels for one or more transistor or sets of transistors.

Next, at 406, the process programs or configures one or more gate bias generators for the critical circuit path(s). The gate bias generator(s) generate one or more gate bias levels selected at 403.

Note that the process need not confine itself to merely the identified critical circuit paths or blocks. Instead, or in addition, the user may identify and specify circuit paths or blocks that the user desired to meet specific performance criteria. For example, the user may wish to have a high-speed adder implemented within the PLD. The user may identify the circuitry or blocks used to implement the adder and specify to the software to adjust the gate bias level(s) of the transistors in the circuitry or blocks to meet certain timing specifications. The user may provide other performance specifications or criteria, such as power dissipation. The software may trade off the various performance specifications to select the gate bias level(s) of the transistors in the circuit path(s) or blocks.

Figure 16:
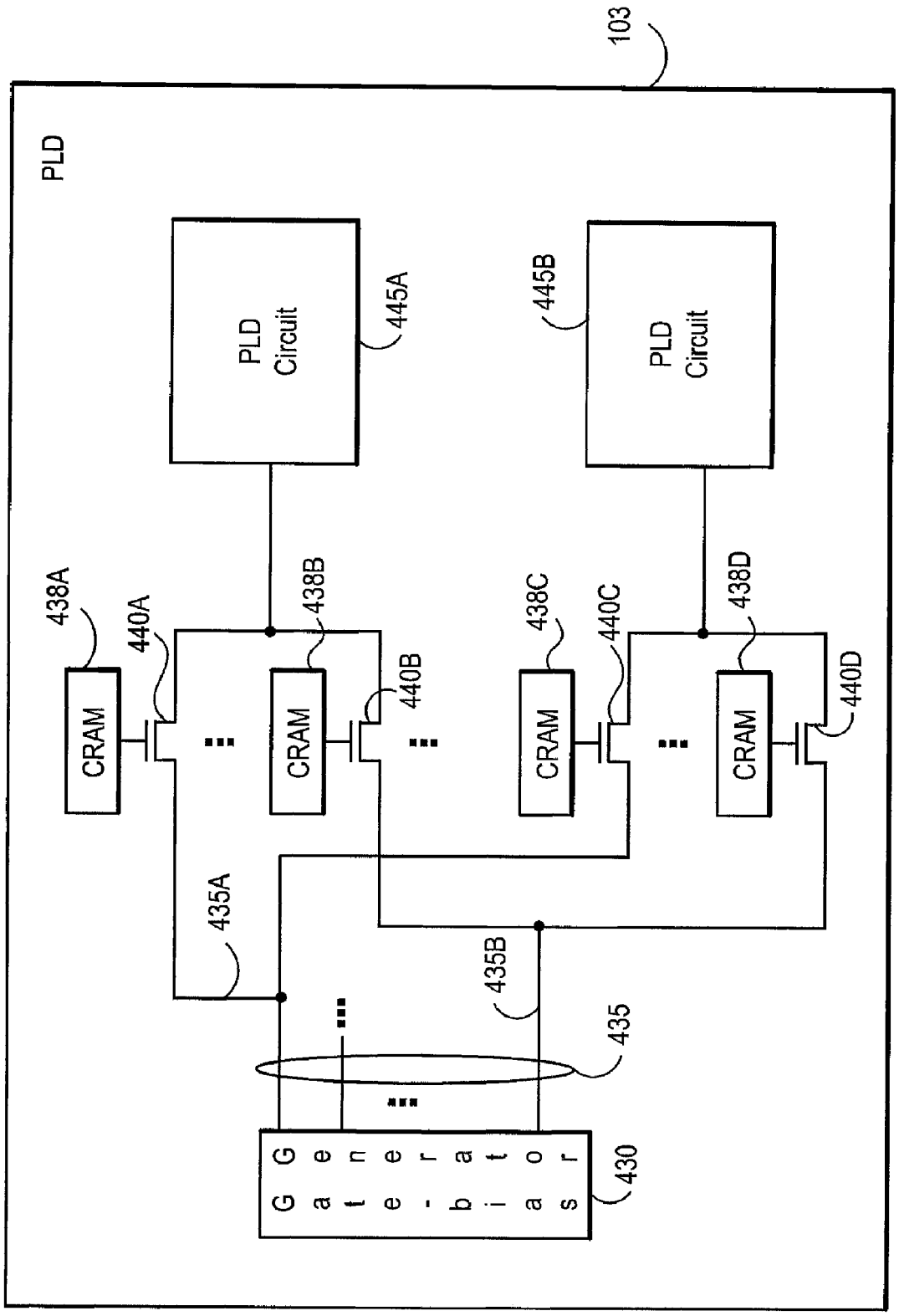
FIG. 16 illustrates a block diagram of circuitry within a PLD according to exemplary embodiments of the invention to adjust, program, or set the gate bias levels of desired PLD circuitry or blocks.

FIG. 16 shows a block diagram of circuitry within a PLD according to exemplary embodiments of the invention to adjust, program, or set the lower or back gate bias levels of desired PLD circuitry or blocks. The circuitry includes gate bias generator 430, a plurality of configuration memory (configuration random-access memory, or CRAM, or other implementations of the memory) cells 438A-438D, a plurality of transistors 440A-440D, and PLD circuits 445A-445B. Gate bias generator 430 generates one or more gate bias signals 435 and provides those signal(s) to transistors 440A-440D. In response to a respective one of the data in CRAM cells 438A-438, transistors 440A-440D provide the gate bias signals 435 to PLD circuits 445A-445B. PLD circuits 445A-445B may constitute circuitry whose transistors' gate bias levels one wishes to set, program, or adjust, such as individual transistors, groups of transistors, circuit blocks, etc., as described above.

For example, suppose that CRAM cells 438A and 438C store binary ones, whereas CRAM cells 438B and 438D store binary zeros. Consequently, transistors 440A and 440C turn ON and provide signal 435A to PLD circuits 445A-445B. Transistors 440B and 440D turn OFF, and therefore do not provide any signals to PLD circuits 445A-445B. As another example, suppose that the reverse situation of the preceding example exists (i.e., CRAM cells 438A-438D hold binary data 0, 1, 0, 1, respectively). In this case, transistors 440A and 440C turn OFF (and thus provide no signals to PLD circuits 445A-445B), and transistors 440B and 440D turn ON. As a result, transistors 440B and 440D provide signal 435B to PLD circuits 445A-445D. In exemplary embodiments, CRAM cells 438A-438D may serve more than one purpose, as desired. More specifically, CRAM cells 438A-438D may control the gate bias of transistors of various circuitry within the PLD (e.g., PLD circuit 445A or 445B). In addition, CRAM cells 438A-438D may serve as routing CRAM cells. In other words, in addition to controlling gate bias levels, one or more of CRAM cells 438A-438D may select one circuit path over another circuit path within a MUX (i.e., select one routing path within a MUX as opposed to an alternative routing path within the MUX), as desired.

Note that one may implement gate bias generator 430 in a variety of ways, as persons of ordinary skill in the art with the benefit of the description of the invention understand. For example, one may use a bias source (e.g., one of a variety of well-known bias sources) and then use a charge pump to generate gate bias signals 435, which are pumped to appropriate or desired levels. As another example, one may use stored digital data corresponding to gate bias levels and use one or more scaler circuits together with one or more digital-to-analog converters (DACs) to generate the desired gate bias signals 435.

Figure 17:
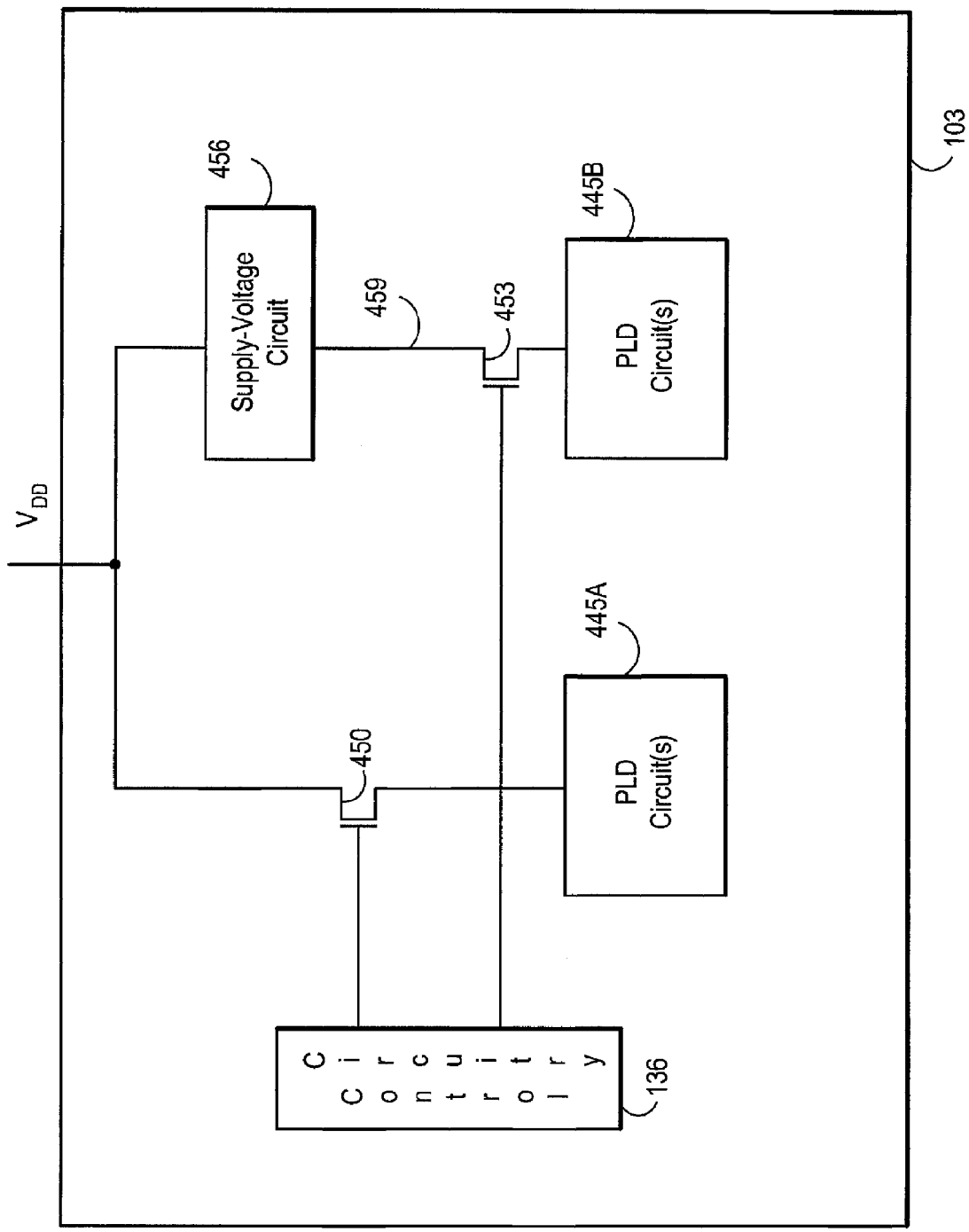
FIG. 17 depicts a block diagram of a circuit for selectively turning off circuitry within a PLD according to exemplary embodiments of the invention.

In addition to adjusting, programming, or setting lower or back gate bias levels, one may use other measures to control the power dissipation and, hence, power density of PLDs. More specifically, one may selectively shut down or turn off portion(s) of the circuitry within a PLD. As a result, one may further reduce the power dissipation within the PLD. FIG. 17 shows a block diagram of a circuit for selectively turning off circuitry within a PLD according to exemplary embodiments of the invention. The circuit includes control circuitry 136, transistor 450, and PLD circuit(s) 445A. In addition, the circuit may include transistor 453, supply-voltage circuit 456, and PLD circuit(s) 445B.

Suppose that one wishes to shut down PLD circuit(s) 445A. Transistor 450 couples PLD circuit 445A to the supply voltage, $V_{DD}$. In other words, when transistor 450 is ON, PLD circuit(s) 445A receive(s) the supply voltage, and vice-versa. Transistor 450 turns ON and OFF in response to a control signal from control circuitry 136. Thus, to turn off PLD circuit(s) 445A, one causes control circuitry 136 to de-assert the gate signal of transistor 450 and interrupt the supply voltage to PLD circuit(s) 445A. One may subsequently turn ON PLD circuit(s) 445A by asserting the gate signal of transistor 450 under the supervision of control circuitry 136.

PLD 103 may use more than one supply voltage, as desired. In other words, one may optionally use supply-voltage circuit 456 to generate secondary supply-voltage 459 from the primary supply voltage, $V_{DD}$. Secondary supply-voltage 459 may have a smaller or larger magnitude than the primary supply voltage, as desired. Furthermore, one may use more than one secondary supply-voltage, as desired. Secondary supply-voltage 445B powers PLD circuit 445B. One may shut down or power up PLD circuit(s) 445B by, respectively, de-asserting and asserting the gate signal of transistor 453 under the supervision of control circuitry 136. Note that each PLD circuit 445A may constitute a PLD block (see, for example, FIGS. 1, 10, and 11), a portion of a PLD block, or a set of PLD blocks, as desired. In other words, one may selectively apply the technique shown in FIG. 17 (power up and power down) to one or more blocks, sub-blocks, or portions of block(s) within a PLD, as desired.

Figure 18:
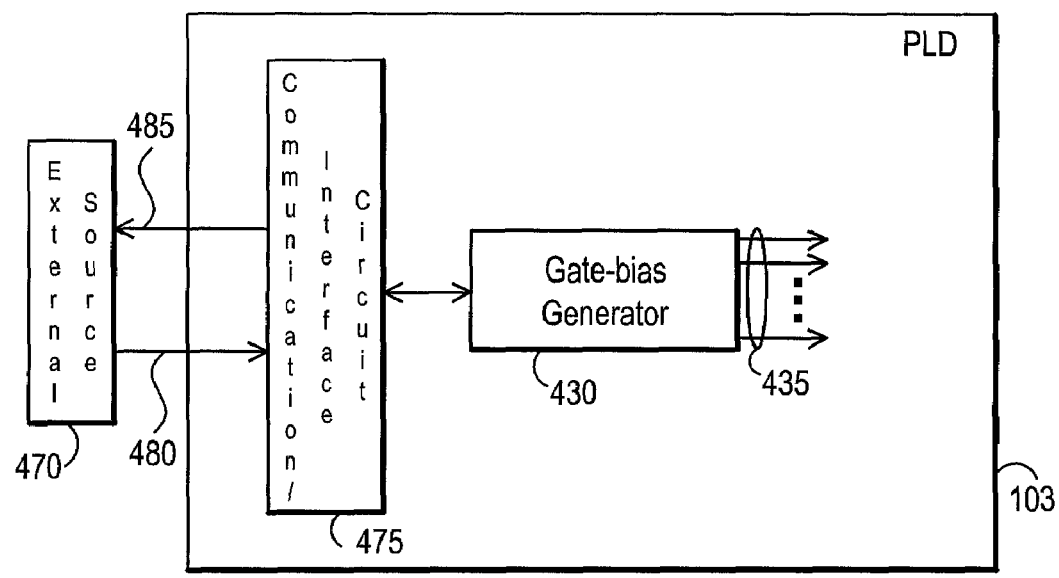
FIG. 18 shows a circuit arrangement according to exemplary embodiments of the invention for adjusting gate bias levels within a PLD in response to an external source.

Note that one may adjust, program, or set lower or back gate bias levels in response to sources external to the PLD. For example, one may communicate gate bias levels to a PLD to adjust or modify its performance. FIG. 18 shows a circuit arrangement according to exemplary embodiments of the invention for adjusting gate bias levels within a PLD in response to an external source 470. The circuit arrangement includes external source 470, communication/interface circuit 475, and gate bias generator 430. Communication/interface circuit 475 provides a mechanism for external source 470 and gate bias generator 430 to communicate and exchange information. External source 470 may provide one or more control signal(s) 480 to communication/interface circuit 475 within PLD 103. Communication/interface circuit 475 provides the information received from external source 470 to gate bias generator 430. In response, gate bias generator 430 generates one or more gate bias signals 435, with levels corresponding to control signal(s) 480. Communication/interface circuit 475 may provide information, such as status signals, from gate bias generator 430 (or PLD 103 generally) to external source 470. External source 470 may constitute a variety of devices, structures, or arrangements, as persons of ordinary skill in the art with the benefit of the description of the invention understand. For example, external source 470 may constitute the Internet, a computer network, a bus, etc., as desired.

Note that one may adjust, program, or set the lower or back gate bias levels in PLDs on a dynamic or time-varying basis, as desired, to take into account or respond to changing conditions (for example, changes in performance specifications). As one example, referring to FIG. 18, external source 470 may update or modify control signal(s) 480 that it provides to PLD 103. In response, gate bias generator 430 provides gate bias signals 435 that correspond to the updated or modified control signal(s) 480.

Figure 19:
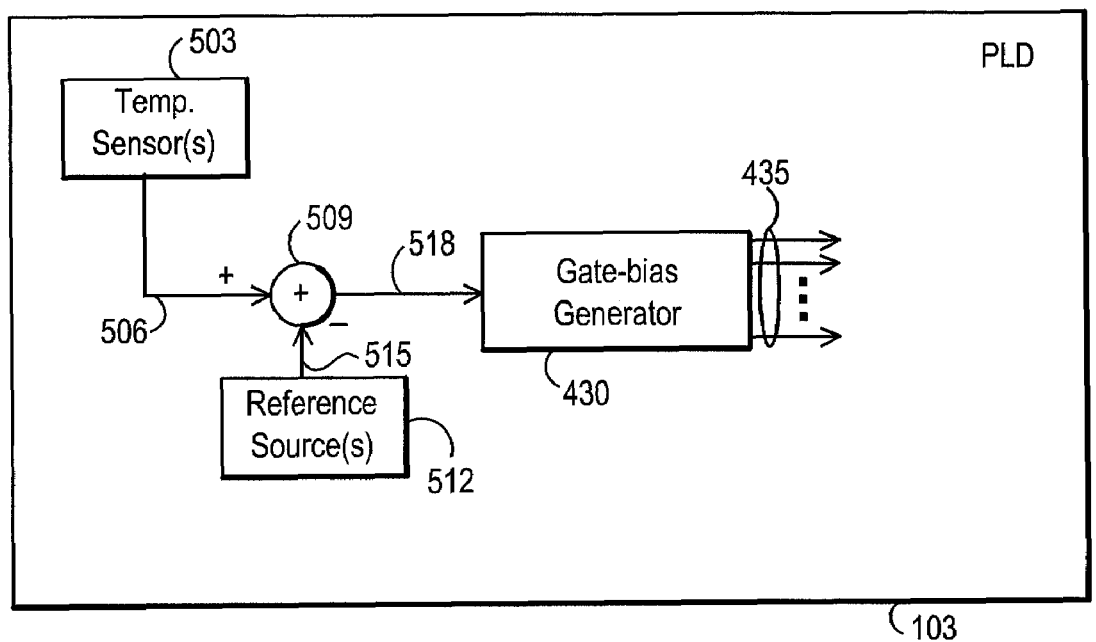
FIG. 19 illustrates a circuit arrangement for modifying gate bias level(s) within a PLD according to exemplary embodiments of the invention.

As another example, one may change or adjust gate bias levels in response to changes within PLD 103 itself, for instance, a change in temperature in one or more circuits or areas of PLD 103. FIG. 19 shows a circuit arrangement for modifying gate bias level(s) within a PLD according to exemplary embodiments of the invention. The circuit arrangement includes one or more temperature sensor(s) 503, one or more reference source(s) 512, subtracter 509, and gate bias generator 430. Temperature sensor(s) 503 sense the temperature in one or more areas, circuits, or blocks within PLD 103 and provide temperature signal(s) 506 to subtracter 509. Reference source(s) 512 provide reference signal(s) 515 to subtracter 509. Reference signal(s) 515 may have values that correspond to various temperature levels.

Subtracter 509 subtracts reference signal(s) 515 from temperature signal(s) 506 and provides difference signal(s) 518 to gate bias generator 430. Difference signal(s) 518 may constitute the difference between actual temperatures and desired temperatures in one or more parts of PLD 103. In response to difference signal(s) 518, gate bias generator 430 generates gate bias signal(s) 435. Gate bias generator 430 may use difference signal(s) 518 to generate gate bias signal(s) 435 that affect various aspects of the performance of PLD 103. For example, if difference signal(s) 518 indicate a lower temperate than a threshold or maximum temperature, gate bias generator 430 may generate gate bias signal(s) that decrease the threshold voltage of one or more transistors within PLD 103 (and hence cause increased performance).

In contrast, if difference signal(s) 518 indicate a temperature level higher than a safe or maximum level, gate bias generator 430 may generate gate bias signal(s) that increase the threshold voltage of one or more transistors within PLD 103 (thus causing decreased temperature levels, albeit decreased performance). More generally, one may implement a feedback loop that generates gate bias level(s) so as to target specific performance criteria. Put another way, one may compare actual performance measures of a PLD to desired or specified measures or criteria and adjust, program, or set gate bias levels accordingly.

Figure 20:
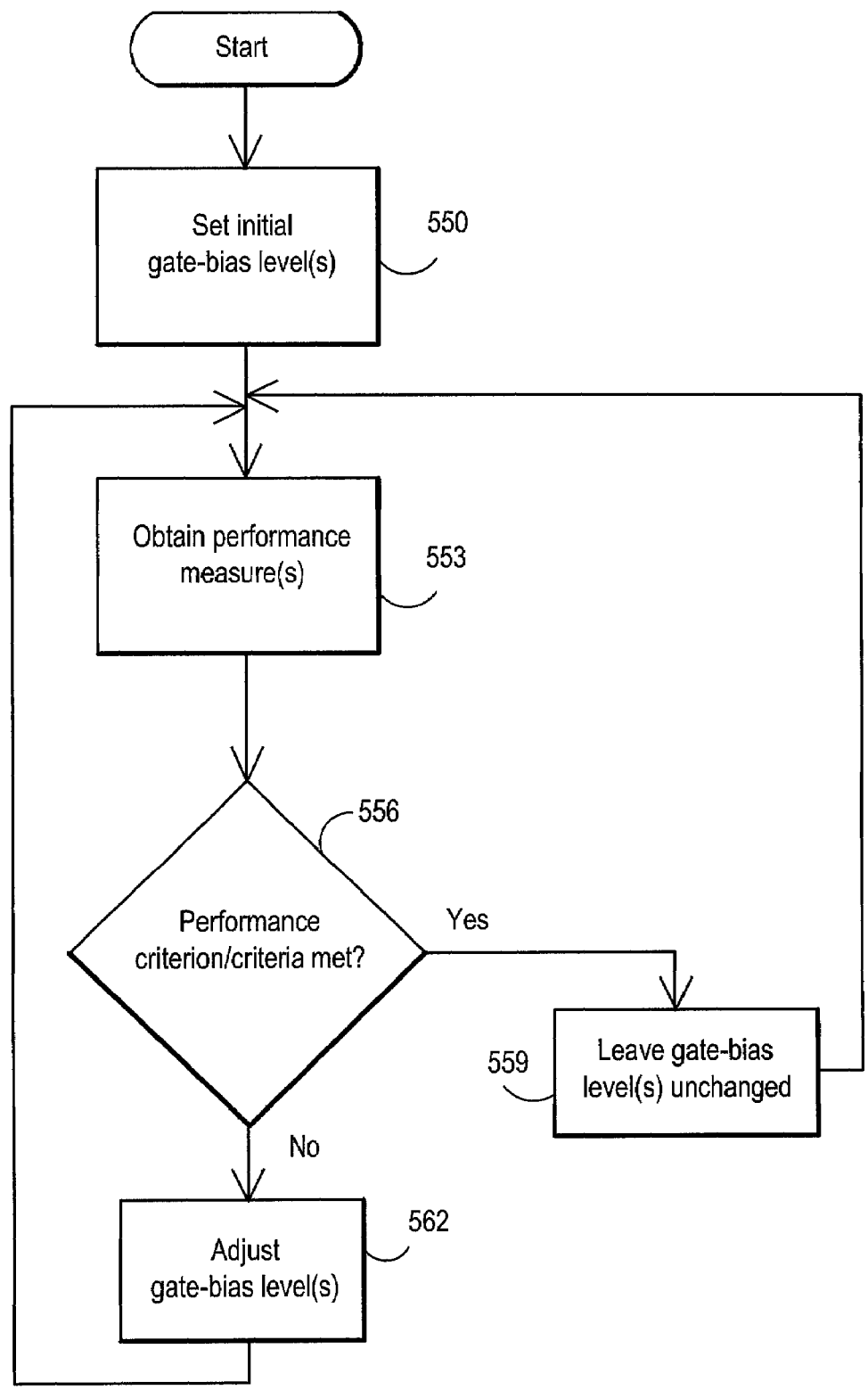
FIG. 20 depicts a flow diagram for a process or technique of adjusting, programming, or setting gate bias levels in a PLD used in exemplary embodiments of the invention.

FIG. 20 shows a flow diagram for a process or technique of adjusting, programming, or setting lower or back gate bias levels in a PLD used in exemplary embodiments of the invention. One may implement the process or technique by using appropriate circuitry (or a combination of circuitry and software or firmware), such as control circuitry 136. The process operates as follows. At 550, one sets or programs initial gate bias level(s) for desired portion or portions of the PLD. Subsequently, at 553, one obtains performance measure(s) of the PLD. The performance measures may include a wide variety of criteria, such as the time a given operation takes, power consumption, power density, throughput, on-chip self test results, and the like, as persons of ordinary skill in the art who have the benefit of the description of the invention understand.

Next, at 556, the process checks to determine whether the actual performance measure(s) meet the desired or specified criterion or criteria. If so, at 559, the process leaves the gate bias level(s) unchanged. On the other hand, if the actual performance measure(s) fail to meet the specified criterion or criteria, at 562 the process adjusts, programs, or sets new or updated gate bias levels so as to reduce the difference between the actual and desired performance measure(s). The process then returns to 553 to check whether the effect of the new gate bias level(s) on the actual performance measure(s). The process may continue indefinitely or a given number of times, as desired.

Figure 21:
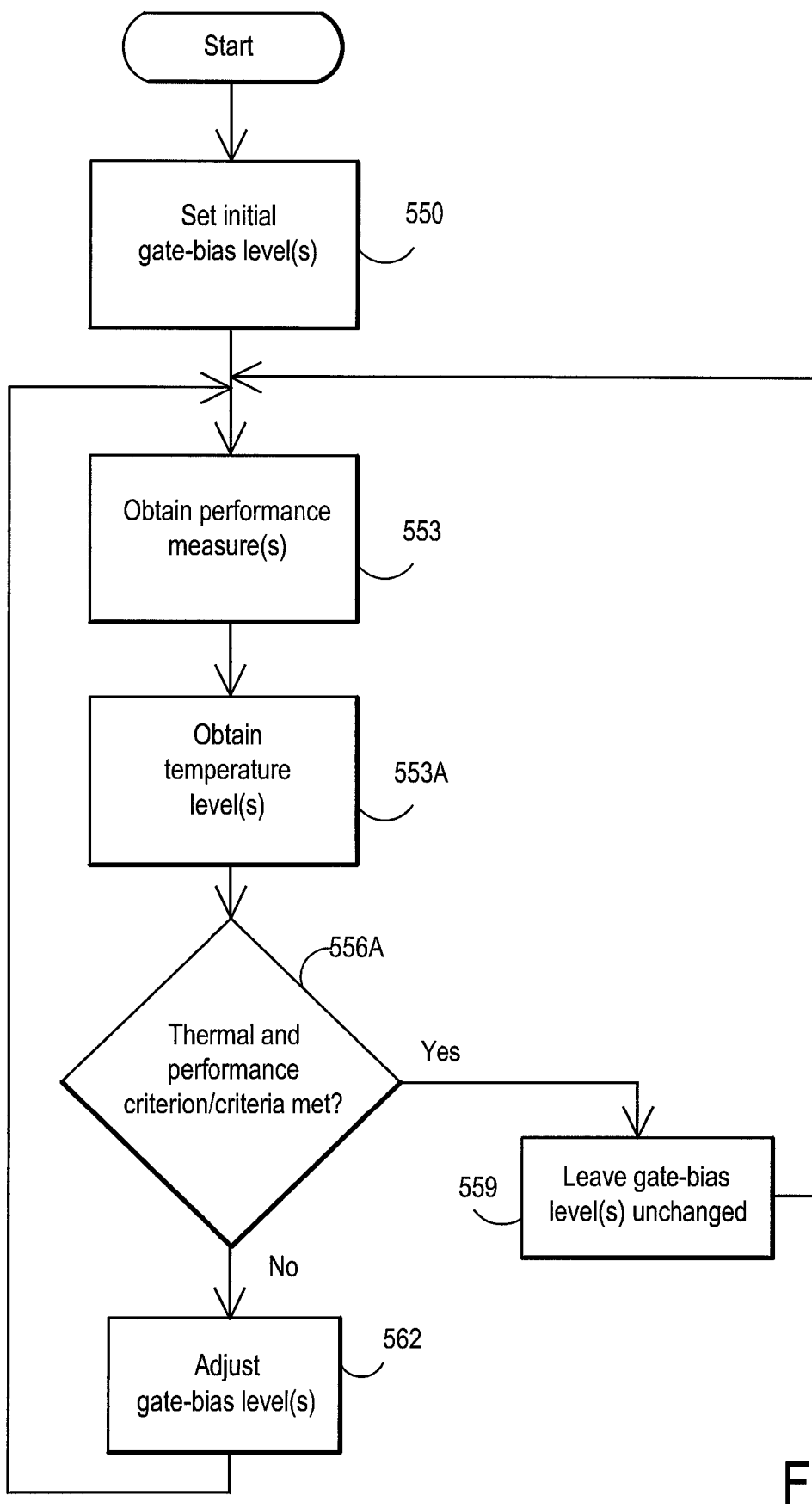
FIG. 21 shows a flow diagram for a process or technique of adjusting, programming, or setting gate bias level(s) that takes temperature level(s) into account.

In addition to checking performance measures (e.g., speed of operation, throughput, power consumption), one may check temperature level(s) of one or more parts or circuits within the PLD. FIG. 21 shows a flow diagram for a process or technique of adjusting, programming, or setting lower or back gate bias level(s) that takes temperature level(s) into account. As noted above, one may implement the process or technique by using appropriate circuitry (or a combination of circuitry and software or firmware), such as control circuitry 136. At 550, the process sets, programs, or adjusts the initial gate bias level(s) for desired transistors, circuits, blocks, and the like, within the PLD. At 553, it obtains performance measures. The performance measures may include a wide variety of parameters or variables, as noted above. The choice of performance measures depends on factors such as design and performance specifications for the circuit or system that the PLD implements, as persons of ordinary skill in the art understand.

Subsequently, a 553A, the process obtains temperature level(s). As noted above, one may obtain and check one or more temperature levels from various parts of the PLD. In exemplary embodiments, one may obtain temperature level(s) from any identified critical path(s) or, in general, any circuitry that may have relatively high power consumption and, hence, relatively high temperature levels. At 556A, the process checks to determine whether the actual performance measure(s) meet the desired or specified criterion or criteria. Furthermore, the process checks to determine whether the actual temperature level(s) meet the desired or specified criterion or criteria (e.g., whether the actual temperature falls within a prescribed range or below a threshold level, etc.).

If both conditions hold, at 559, the process leaves the gate bias level(s) unchanged. If both conditions fail to hold, however, at 562 the process adjusts, programs, or sets new or updated gate bias levels so as to reduce the difference between the actual and desired performance measure(s) and between the actual and desired or prescribed temperature level(s). The process then returns to 553 to check whether the effect of the new gate bias level(s) on the actual performance measure(s) and on the temperature level(s). The process may continue indefinitely or a given number of times, as desired.

In other embodiments, one may adjust, program, or set the gate bias level(s) in response to or depending on the operating environment of the circuit or system that the PLD implements. For example, suppose that one uses a PLD according to the invention to realize a communications network controller or router. During operation, the PLD may obtain information about the conditions or characteristics of the environment in which the controller or router operates.

For instance, the PLD may obtain measures relating to the traffic levels within that environment. Depending on the conditions in, or characteristics of, its operating environment, the PLD may adjust, program, or set lower or back gate bias level(s) in one or more of its transistors so that its performance matches the needs of the operating environment. Of course, the example above constitutes merely one illustration of how one may use such PLDs. One may apply the inventive concepts to a wide variety of circuits, systems, and operating environments, each with their own characteristics and conditions, as persons of ordinary skill in the art who have the benefit of the description of the invention understand.

Figure 22:
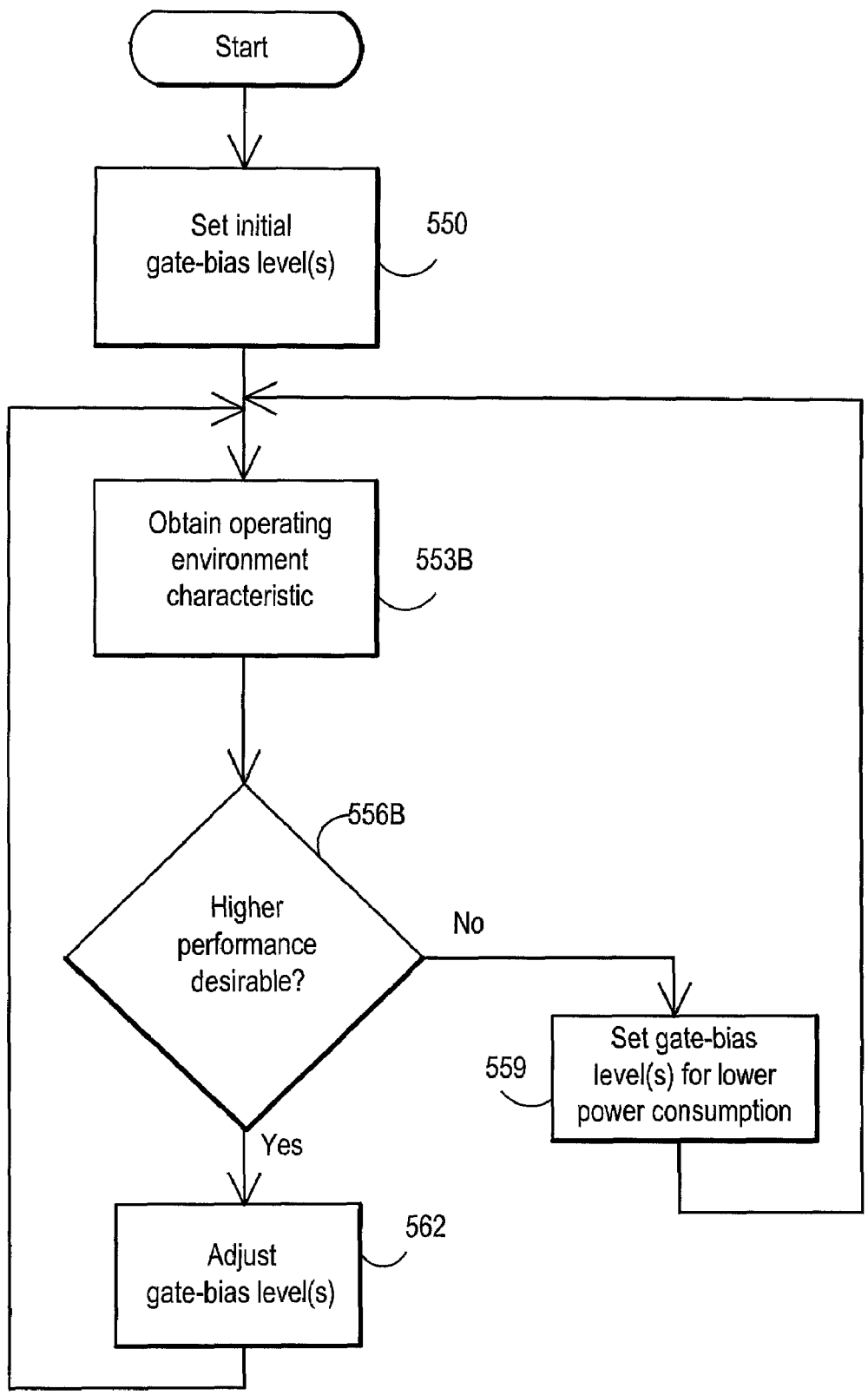
FIG. 22 illustrates a flow diagram for a process or technique of adjusting, programming, or setting gate bias level(s) that takes into account the characteristics of the environment in which the PLD operates.

FIG. 22 shows a flow diagram for a process or technique of adjusting, programming, or setting lower or back gate bias level(s) that takes into account the characteristics or conditions of the environment in which the PLD operates. As noted above, one may implement the process or technique by using appropriate circuitry (or a combination of circuitry and software or firmware), such as control circuitry 136. The process operates as follows. At 550, one programs or sets initial gate bias level(s) for desired portion or portions of the PLD. Subsequently, at 553B, one obtains one or more conditions or characteristics of the environment, circuit, or system in which the PLD operates. The conditions or characteristics may include a wide variety of items, as noted above.

Next, at 556B, the process checks to determine whether the conditions or characteristics of the operating environment make desirable higher performance levels of the PLD. (To use the example above, for instance, whether network traffic levels are relatively high, thus making higher PLD performance or throughput more desirable.) If not, at 559, the process leaves the gate bias level(s) unchanged. On the other hand, if higher PLD performance or throughput are desirable, at 562 the process adjusts, programs, or sets new or updated gate bias levels so as to reduce the difference between the actual and desired performance measure(s). The process then returns to 553B to check whether the effect of the new gate bias level(s) on the actual performance measure(s). The process may continue indefinitely or a given number of times, as desired.

Figure 23:
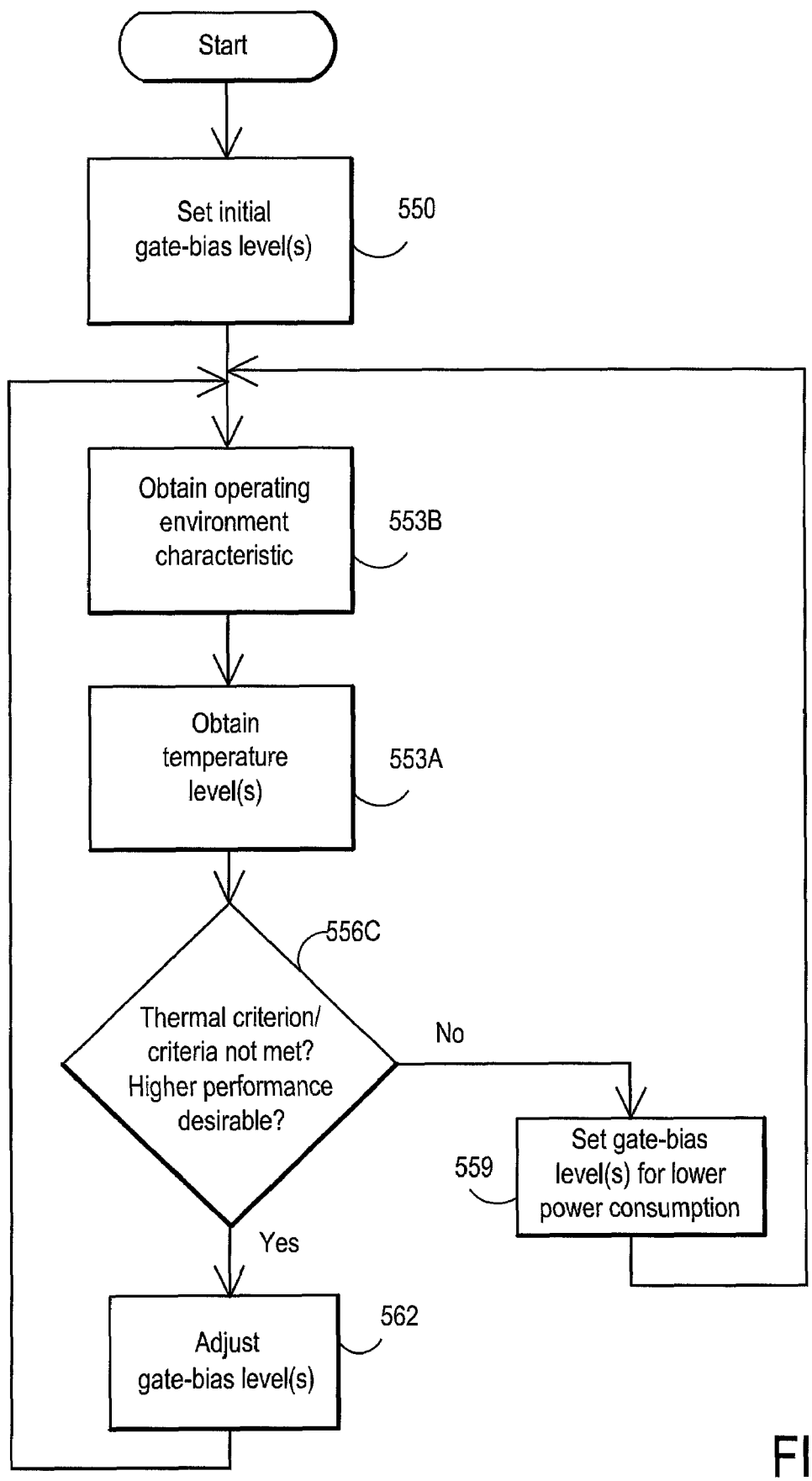
FIG. 23 depicts a flow diagram for a process or technique of adjusting, programming, or setting gate bias level(s) that takes into account temperature level(s) and the characteristics of the environment in which the PLD operates.

One may use a variety of embodiments according to the inventive concepts, depending on factors such as design and performance specifications for a given application or implementation. For example, referring to FIG. 22, note that, similar to the embodiment described in connection with FIG. 21, one may take into account temperature level(s) of various parts of the PLD, as desired. Put another way, one may examine not only the desirability of higher PLD performance or throughput, but also whether temperature level(s) or power densities within the PLD make increased PLD performance safe or appropriate. FIG. 23 shows a process for realizing such an embodiment. One may repeat the procedure a desired number of times, depending on the application. As noted above, one may implement the process or technique by using appropriate circuitry (or a combination of circuitry and software or firmware), such as control circuitry 136.

Furthermore, one may combine the performance-tuning concepts described above with other techniques to reduce power densities or keep them within safe ranges. For example, one may turn ON or OFF various circuits within the PLD (see FIG. 17 and accompanying description) to accomplish a tradeoff between desired performance levels and safe or prescribed power consumption levels or power densities. Other variations and embodiments will be apparent to persons of ordinary skill in the art who have the benefit of the description of the invention.

Generally, note that one may apply the inventive concepts effectively to various programmable logic circuitry or ICs known by other names in the art, as desired, and as persons skilled in the art with the benefit of the description of the invention understand. Such circuitry include devices known as complex programmable logic device (CPLD), programmable gate array (PGA), aid field programmable gate array (FPGA). More generally, one may apply the inventive concepts to any special-purpose or general-purpose IC, as desired.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only. The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A method of configuring a programmable logic device (PLD) to implement an electronic circuit, the method comprising:

mapping the electronic circuit to functional resources within the programmable logic device (PLD) to generate a design to be implemented by the programmable logic device (PLD);

identifying at least one critical circuit path in the design to be implemented by the programmable logic device (PLD); and programming a gate bias level of at least one multi-gate transistor in the at least one critical circuit path.

2. The method according to claim 1, wherein programming a gate bias level of the at least one transistor further comprises programming a configuration memory (CRAM) of the programmable logic device (PLD).

3. The method according to claim 2, wherein programming a gate bias level of the at least one transistor changes a threshold voltage of the transistor.

4. The method according to claim 1, further comprising disabling unused functional resources within the programmable logic device (PLD).

5. The method according to claim 1, wherein programming a gate bias level of at least one transistor further comprises setting the gate bias level so as to avoid thermal runaway in the at least one transistor.

6. The method according to claim 1, wherein programming a gate bias level of the at least one transistor further comprises setting the gate bias level so as to trade off performance and power consumption of the at least one transistor.

7. The method according to claim 6, wherein setting the gate bias level so as to trade off performance and power consumption of the at least one transistor further comprises optimizing the tradeoff between the performance and power consumption of the at least one transistor.

8. The method according to claim 1, wherein the at least one transistor comprises a semiconductor-on-insulator (SOI) transistor.

9. The method according to claim 8, wherein the at least one transistor comprises a fully depleted semiconductor-on-insulator (SOI) transistor.

* * * * *